United States Patent
Lee et al.

(10) Patent No.: US 10,921,160 B2
(45) Date of Patent: Feb. 16, 2021

(54) SENSING CIRCUIT OF MOVING BODY AND MOVING BODY SENSING DEVICE

(71) Applicant: Samsung Electro-Mechanics Co., Ltd., Suwon-si (KR)

(72) Inventors: Jong Woo Lee, Suwon-si (KR); Woo Young Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 14 days.

(21) Appl. No.: 16/429,170

(22) Filed: Jun. 3, 2019

(65) Prior Publication Data

US 2020/0166380 A1 May 28, 2020

(30) Foreign Application Priority Data

Nov. 22, 2018 (KR) .................. 10-2018-0145613
Mar. 14, 2019 (KR) .................. 10-2019-0029210

(51) Int. Cl.
*G01R 23/02* (2006.01)
*G01D 5/245* (2006.01)
(Continued)

(52) U.S. Cl.
CPC ......... *G01D 5/245* (2013.01); *G01D 5/24485* (2013.01); *G01R 23/02* (2013.01); *H03K 21/40* (2013.01)

(58) Field of Classification Search
CPC .... G01D 5/245; G01D 5/24485; G01D 5/241; G01D 5/2415; G01D 5/2412; G01D 5/2417; G01D 5/206; G01D 5/14; G01D 5/165; G01R 31/312; G01R 31/08; G01R 31/2805; G01R 31/2812; G01R 31/2887; G01R 31/2831; G01R 27/2605; G01R 23/02

See application file for complete search history.

(56) References Cited

U.S. PATENT DOCUMENTS 3,964,703 A * 6/1976 Wilkas .............. B61L 1/08
246/34 R
2013/0220028 A1* 8/2013 Kondo .............. G01F 1/06
73/861.77
(Continued)

FOREIGN PATENT DOCUMENTS

KR 10-2018-0046833 A 5/2018

*Primary Examiner* — Thang X Le
(74) *Attorney, Agent, or Firm* — NSIP Law

(57) ABSTRACT

A sensing circuit in a device having a moving body in which a unit to be detected including first and second pattern units spaced apart from each other is formed includes an oscillation circuit unit including first and second oscillation circuits fixedly mounted on a substrate spaced apart from the unit to be detected, including, respectively, first and second sensing coils having first and second inductance values depending on areas of overlap between the first and second sensing coils and the first and second pattern units and outputting, respectively, first and second sensed oscillation signals based on the first and second inductance values; and a sensing circuit outputting an output signal having movement information of the moving body based on each period count value for each of the first and second sensed oscillation signals using a reference oscillation signal.

14 Claims, 19 Drawing Sheets

(51) Int. Cl.
G01D 5/244 (2006.01)
H03K 21/40 (2006.01)

(56) References Cited

U.S. PATENT DOCUMENTS

| | | | |
|---|---|---|---|
| 2014/0102219 A1* | 4/2014 | Kuwahara | B62D 5/0481 73/862.333 |
| 2014/0195117 A1* | 7/2014 | Kuwahara | G01L 25/006 701/41 |
| 2018/0120364 A1 | 5/2018 | Lee et al. | |
| 2018/0248498 A1* | 8/2018 | Piitulainen | H02P 25/064 |

* cited by examiner

SENSING CIRCUIT OF MOVING BODY AND MOVING BODY SENSING DEVICE

CROSS-REFERENCE TO RELATED APPLICATION(S)

This application claims the benefit under 35 USC § 119(a) of Korean Patent Application Nos. 10-2018-0145613 filed on Nov. 22, 2018, and 10-2019-0029210 filed on Mar. 14, 2019 in the Korean Intellectual Property Office, the entire disclosure of which are incorporated herein by reference for all purposes.

BACKGROUND

1. Field

The present disclosure relates to a sensing circuit of a moving body and a moving body sensing device.

2. Description of Related Art

In general, a rotating body has been used in various fields such as, for example, a motor and a wheel switch of a wearable device, which need to be miniaturized and to have a slim profile. A sensing circuit sensing a position of the rotating body also needs to sense a fine displacement of the rotating body.

A precise signal is needed for a sensing device, where a frequency is high and noise such as, jitter, is low, in a sensing manner based on a reference oscillation signal. For example, in the sensing device based on the reference oscillation signal, a manner of sensing rotation of the rotating body by measuring a frequency of an input sensed signal using a reference clock having a high frequency may be used.

Such a sensing device uses the reference clock having the high frequency to consume a large amount of power and thus requires a large amount of power. In addition, when using one sensing coil to sense the rotating body, when noise such as, jitter, is included in a sensed signal of a measurement target, a sensing error may occur.

In addition, a separate complicated circuit to remove such noise is needed, a design of the sensing device is complicated, and a cost for manufacturing the sensing device increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect there is disclosed a sensing circuit in a device having a moving body in which a unit to be detected including first and second pattern units spaced apart from each other is formed, including an oscillation circuit unit including first and second oscillation circuits fixedly mounted on a substrate spaced apart from the unit to be detected, each of the first and second oscillation circuits including, respectively, first and second sensing coils having first and second inductance values depending on areas of overlap between the first and second sensing coils and the first and second pattern units, and the first and second oscillation circuits being configured to output, respectively, first and second sensed oscillation signals based on the first and second inductance values, and a sensing circuit configured to output an output signal having movement information of the moving body based on each period count value for each of the first and second sensed oscillation signals using a reference oscillation signal.

The first oscillation circuit may include a first capacitor connected to the first sensing coil in parallel to contribute LC oscillation and to generate the first sensed oscillation signal, and the second oscillation circuit may include a second capacitor connected to the second sensing coil in parallel to contribute LC oscillation and to generate the second sensed oscillation signal.

The sensing circuit may include a frequency divider configured to divide a frequency of the reference oscillation signal and to output a frequency-divided reference oscillation signal, a period counting circuit unit may include first and second period counting circuits configured to generate, respectively, the first and second sensed signals having first and second period count values counted using the frequency-divided reference oscillation signal for each of the first and second sensed oscillation signals, and a calculation circuit unit configured to calculate the first and second sensed signals to generate the output signal.

The first period counting circuit may include a first period counter configured to count a period of the frequency-divided reference oscillation signal using the first sensed oscillation signal to generate a first period count value for the frequency-divided reference oscillation signal, and a first filter configured to amplify the first period count value using an accumulated gain to generate a first amplified period count value and to provide the first amplified period count value as the first sensed signal.

The second period counting circuit may include a second period counter configured to count a period of the frequency-divided reference oscillation signal using the second sensed oscillation signal to generate a second period count value for the frequency-divided reference oscillation signal, and a second filter configured to amplify the second period count value using an accumulated gain to generate a second amplified period count value and to provide the second amplified period count value as the second sensed signal.

The first and second filters may be configured to determine the accumulated gain using a preset stage order and a decimator factor.

The first and second filters may be configured to determine the accumulated gain as a multiplier of the stage order for the decimator factor.

The calculation circuit unit may be configured to perform a division on the first sensed signal and the second sensed signal to generate the output signal.

According to another aspect there is disclosed a moving body sensing device including a unit to be detected configured to be disposed in a moving body to move based on movement of the moving body and to comprise first to N-th pattern units spaced apart from each other, an oscillation circuit unit including first to N-th oscillation circuits fixedly mounted on a substrate spaced apart from the unit to be detected, each of first to N-th oscillation circuits including, respectively, first to N-th sensing coils having first to N-th inductance values depending on areas of overlap between the first to N-th sensing coils and the first to N-th pattern units, and the first to N-th oscillation circuits being configured to output, respectively, first to N-th sensed oscillation signals based on the first to N-th inductance values, and a sensing circuit configured to output an output signal having movement information of the moving body based on each period count value for each of the first to N-th sensed oscillation signals using a reference oscillation signal, wherein N is a natural number of 3 or more.

The first to N-th pattern units may be formed of any one of a metal and a magnetic material having a same shape.

The oscillation circuit unit may include a first oscillation circuit, a second oscillation circuit, a third oscillation circuit, and a fourth oscillation circuit, the first oscillation circuit may include a first capacitor connected to the first sensing coil in parallel to contribute LC oscillation and to generate the first sensed oscillation signal, the second oscillation circuit may include a second capacitor connected to the second sensing coil in parallel to contribute LC oscillation and to generate the second sensed oscillation signal, the third oscillation circuit may include a third capacitor connected to the third sensing coil in parallel to contribute LC oscillation and to generate the third sensed oscillation signal, and the fourth oscillation circuit may include a fourth capacitor connected to the fourth sensing coil in parallel to contribute LC oscillation and to generate the fourth sensed oscillation signal.

The sensing circuit may include a frequency divider configured to divide a frequency of the reference oscillation signal and to output a frequency-divided reference oscillation signal, a period counting circuit unit may include first to fourth period counting circuits generating, respectively, the first to fourth sensed signals having first to fourth period count values counted using the frequency-divided reference oscillation signal for each of the first to fourth sensed oscillation signals, and a calculation circuit unit configured to calculate the first to fourth sensed signals to generate first and second calculated signals and to output the output signal using the first and second calculated signals.

The first to fourth period counting circuits may include, respectively, first to fourth period counters configured to count a period of the frequency-divided reference oscillation signal using the first to fourth sensed oscillation signals, respectively, to generate the first to fourth period count values for the frequency-divided reference oscillation signal, and first to fourth filters configured to amplify the first to fourth period count values using an accumulated gain to generate first to fourth amplified period count values and to provide the first to fourth amplified period count values as the first to fourth sensed signals.

The first to fourth filters may be configured to determine the accumulated gain using a preset stage order and a decimator factor.

The first to fourth filters may be configured to determine the accumulated gain as a multiplier of the stage order for the decimator factor.

The calculation circuit unit may include a first calculation circuit configured to generate the first calculated signal using the first to fourth sensed signals, a second calculation circuit configured to generate the second calculated signal using the first to fourth sensed signals, and a third calculation circuit configured to generate the output signal using the first and second calculated signals.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
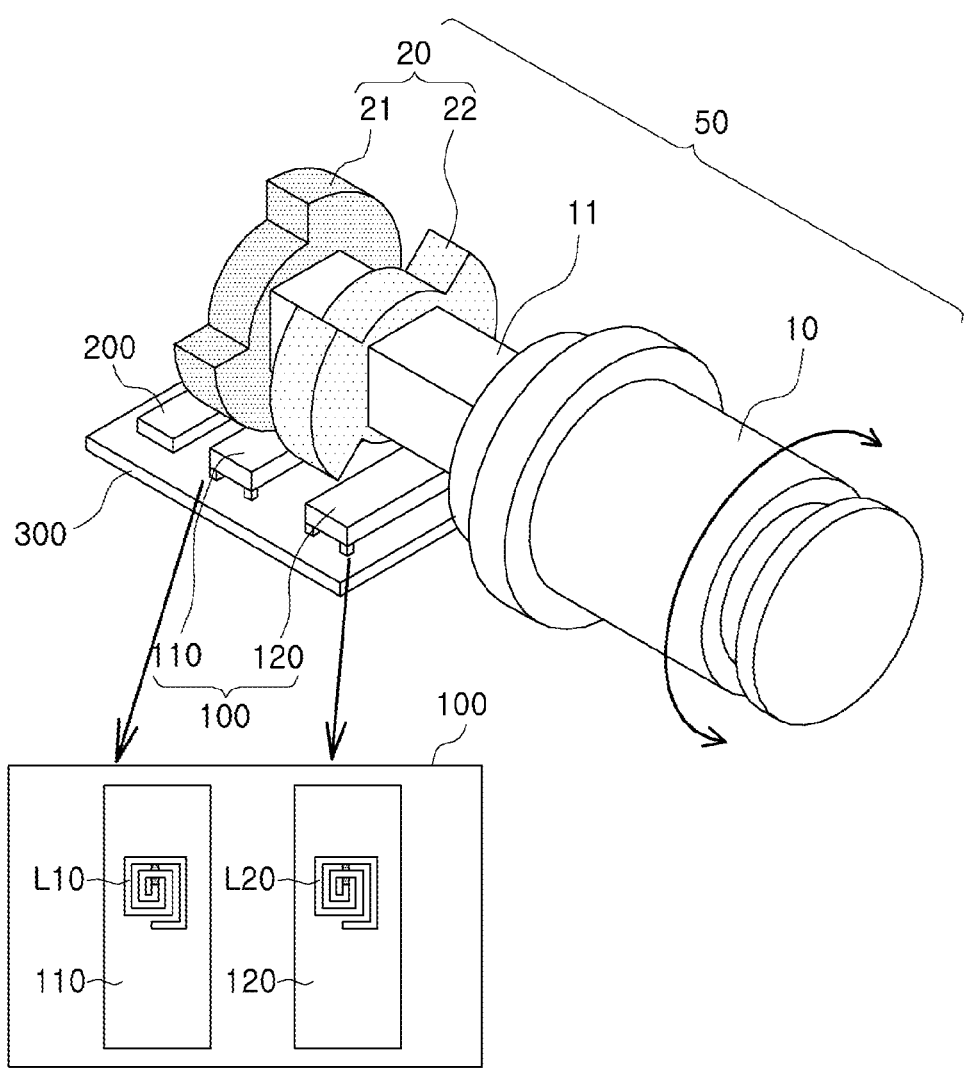
FIG. 1 is a diagram illustrating an example of a moving body sensing device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. When an element is referred to as being "directly on," "directly connected to," or "directly coupled to" another element, there may be no elements or layers intervening therebetween. Like numerals refer to like elements throughout.

The terminology used herein is for describing various examples only, and is not to be used to limit the disclosure. As used herein, the term "and/or" includes any and all combinations of one or more of the associated listed items.

The use of the term "may" with respect to an example or embodiment, e.g., as to what an example or embodiment may include or implement, means that at least one example or embodiment exists in which such a feature is included or implemented while all examples and embodiments are not limited thereto.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

FIG. 1 is a diagram illustrating an example of a moving body sensing device.

Referring to FIG. 1, a moving body sensing device may include a unit 20 to be detected and a moving body sensing circuit. The moving body sensing circuit may include an oscillation circuit 100 including a sensing element and a sensing circuit 200. The moving body sensing device may further include a substrate 300.

In an example, moving body may be a rotating body that is used in devices such as, for example, a smartwatch or a lens moving body used in an actuator of a camera device. The moving body may be used in a device having an object to be detected that moves in order to detect a position change on the basis of a change in an impedance or a change in a frequency generated between a magnetic material (or a magnet) and a sensing coil with respect to movement. In an example, the moving body will hereinafter be assumed to be a rotating body, but is not limited thereto.

The unit 20 to be detected may be formed in a rotating body 50, and may be connected to a wheel 10 through a shaft 11 of the rotating body 50. The rotating body 50 may be used in an electronic device, and may be rotated clockwise or counterclockwise by a user. The unit 20 to be detected may rotate clockwise or counterclockwise together with the wheel 10 of the rotating body 50.

The unit 20 to be detected may include a first pattern unit 21 and a second pattern unit 22. The first pattern unit 21 and the second pattern unit 22 may be formed in the same shape, may be spaced apart from each other by a distance along an extending direction of the shaft 11, and may be fixedly coupled to the shaft 11. The first pattern unit 21 and the second pattern unit 22 may be rotated in the same direction and at the same speed by the shaft of the rotating body 50.

Each of the first pattern unit 21 and the second pattern unit 22 may include at least one pattern having the same shape. The first pattern unit 21 may include at least one first pattern, and the second pattern unit 22 may include at least one second pattern.

In FIG. 1, protruding areas of the first pattern unit 21 and the second pattern unit 22 may correspond to the patterns. As an example, at least one first pattern of the first pattern unit 21 and at least one second pattern of the second pattern unit 22 may be manufactured by machining a disk-shaped metal or magnetic material to form a sawtooth. In an example, a first pattern of the first pattern unit 21 and a second pattern of the second pattern unit 22 may be formed of one of the metal and the magnetic material.

A first pattern of the first pattern unit 21 may extend along a rotation direction, and a second pattern of the second pattern unit 22 may extend along the rotation direction. An extending length of the first pattern of the first pattern unit 21 in the rotation direction may be defined as a size of the first pattern, and an extending length of the second pattern of the second pattern unit 22 in the rotation direction may be defined as a size of the second pattern.

When the first pattern unit 21 includes one first pattern and the second pattern unit 22 includes one second pattern, one first pattern and second pattern may have a size corresponding to a rotation angle of 180°.

When it is assumed that the first pattern unit 21 includes a plurality of first patterns and the second pattern unit 22 includes a plurality of second patterns, the plurality of first patterns of the first pattern unit 21 may be arranged to be spaced apart from each other by a distance along the rotation direction, and the plurality of second patterns of the second pattern unit 22 may be arranged to be spaced apart from each other by a distance along the rotation direction. As an example, a spaced distance between the plurality of first patterns of the first pattern unit 21 may be the same as a size of the first pattern, and a spaced distance between the plurality of second patterns of the second pattern unit 22 may be the same as a size of the second pattern.

As an example, the plurality of first patterns of the first pattern unit 21 may have a size corresponding to a rotation angle of 90°, and the spaced distance between the plurality of first patterns may correspond to the rotation angle of 90°. Therefore, the first pattern unit 21 may include two first patterns having a size of 90°. Likewise, the plurality of second patterns of the second pattern unit 22 may have a size corresponding to a rotation angle of 90°, and the spaced distance between the plurality of second patterns may correspond to the rotation angle of 90°. Therefore, the second pattern unit 22 may include two second patterns having a size of 90°.

The sizes and the numbers of first patterns and second patterns may be changed. As an example, the first pattern unit 21 may include three first patterns having a size of 60°, and the second pattern unit 22 may include three second patterns having a size of 60°.

A case in which the first pattern unit 21 includes two first patterns having a size of 90° and the second pattern unit 22 includes two second patterns having a size of 90° will hereinafter be described for convenience of explanation. However, the following description may be applied to pattern units including patterns of which sizes correspond to various angles and the various numbers.

The plurality of first patterns of the first pattern unit 21 and the plurality of second patterns of the second pattern unit 22 may be arranged to have an angle difference therebetween. As an example, the plurality of first patterns of the first pattern unit 21 and the plurality of second patterns of the second pattern unit 22 may be arranged to have an angle difference corresponding to a half of the size of the first pattern and a half of the size of the second pattern therebetween. As an example, the first pattern and the second pattern may be blades having a protruding shape.

When it is assumed that the first pattern unit 21 includes the two first patterns having the size of 90° and the second pattern unit 22 includes the two second patterns having the size of 90°, the plurality of first patterns of the first pattern unit 21 and the plurality of second patterns of the second pattern unit 22 may be arranged to have an angle difference of 45° therebetween. Therefore, partial regions of the plurality of first patterns of the first pattern unit 21 and the plurality of second patterns of the second pattern unit 22 may overlap each other in the extending direction of the shaft 11.

In addition, although not illustrated, the first pattern unit 21 may include three first patterns having a size of 60°, and the second pattern unit 22 may include three second patterns having a size of 60°. However, the first pattern unit 21 and the second pattern unit 22 are not limited to the example described above, and may include one first pattern and second pattern or two or more first patterns and second patterns, respectively. The plurality of first patterns of the first pattern unit 21 and the plurality of second patterns of the second pattern unit 22 may be arranged to have an angle difference of 30° therebetween.

In addition, shapes of the first and second patterns may be rectangular shapes as illustrated in FIG. 1. However, the shapes of the first and second patterns are not limited to those illustrated in FIGS. 1 and 2, and may be of many other shapes, such as, for example, circular, elliptical, rhombic, or trapezoidal shapes.

The oscillation circuit 100 may include a plurality of oscillation circuits. As an example, the oscillation circuit 100 may include a first oscillation circuit 110 and a second oscillation circuit 120.

The first oscillation circuit 110 may be fixedly mounted on the substrate 300 and be spaced apart from the unit 20 to be detected. The first oscillation circuit 110 may include a first sensing coil L10 having a first inductance value depending on an overlapping area between the first sensing coil L10 and the first pattern unit 21, and may output a first sensed oscillation signal LCosc1 based on the first inductance value. The second oscillation circuit 120 may be fixedly mounted on the substrate 300 and be spaced apart from the unit 20 to be detected. The second oscillation circuit 120 may include a second sensing coil L20 having a second inductance value depending on an overlapping area between the second sensing coil L20 and the second pattern unit 22, and may output a second sensed oscillation signal LCosc2 based on the second inductance value.

As an example, the first oscillation circuit 110 may include a first capacitor C10 (FIG. 7) connected to the first sensing coil L10 in parallel to contribute to LC oscillation, and may generate the first sensed oscillation signal LCosc1. The second oscillation circuit 120 (FIG. 7) may include a second capacitor C20 connected to the first sensing coil L20 in parallel to contribute to LC oscillation, and may generate the second sensed oscillation signal LCosc2.

In another example, the first capacitor C10 and the second capacitor 20 may be included in the sensing circuit 200. A case in which the first capacitor C10 and the second capacitor C20 are included in the first and second oscillation circuits 110 and 120, respectively, will hereinafter be described for convenience of explanation, but the first capacitor C10 and the second capacitor C20 are not limited thereto.

The first sensing coil L10 and the second sensing coil L20 may be arranged along the extending direction of the shaft 11. The first sensing coil L10 may be disposed to face the first pattern unit 21, and the second sensing coil L20 may be disposed to face the second pattern unit 22.

By rotation of the first pattern unit 21 and the second pattern unit 22, an area of the first sensing coil L10 overlapping the first pattern of the first pattern unit 21 may be changed, and an area of the second sensing coil L20 overlapping the second pattern of the second pattern unit 22 may be changed. The first and second sensing coils L10 and L20 may sense changes in the areas of overlap between the first and second sensing coils L10 and L20 and the first and second pattern units 21 and 22, respectively.

The first sensing coil L10 and the second sensing coil L20 may have a size, which may be determined in advance. In an example, the size of the first sensing coil L10 and the second sensing coil L20 may be understood as a length thereof corresponding to a rotation direction of the rotating body. As an example, the size of the first sensing coil L10 and the second sensing coil L20 may correspond to a half of the size of the first pattern of the first pattern unit 21 and the second pattern of the second pattern unit 22.

As an example, each of the first sensing coil L10 of the first oscillation circuit 110 and the second sensing coil L20 of the second oscillation circuit 120 may be formed of a circuit pattern on the substrate 300. In an example, each of the first and second sensing coils L10 and L20 may be formed of one of a winding-type inductor coil and a solenoid coil. The first and second sensing coils L10 and L20 may sense a rotation angle of the rotating body depending on inductances changed depending on the areas of overlap between the first and second sensing coils L10 and L20 and the first and second pattern units 21 and 22, respectively.

In an example, the sensing circuit 200 may be an integrated circuit that is mounted on the substrate 300, and be electrically connected to the first oscillation circuit 110 having the first sensing coil L10 and the second oscillation circuit 120 having the second sensing coil L20.

The sensing circuit 200 may output an output signal Sout having movement information of the moving body on the basis of each period count value for each of the first and second sensed oscillation signals LCosc1 and LCosc2 using one reference oscillation signal OSCref.

For example, the sensing circuit 200 may generate an output signal having rotation information including at least one of a rotation direction, a rotation angle, and an angular velocity of the rotating body depending on the changes in the inductances of the first sensing coil L10 and the second sensing coil L20.

In the drawings figures, an overlapping description for components denoted by the same reference numerals and having the same functions may be omitted, and contents different from each other in the respective drawings will be described.

Figure 2:
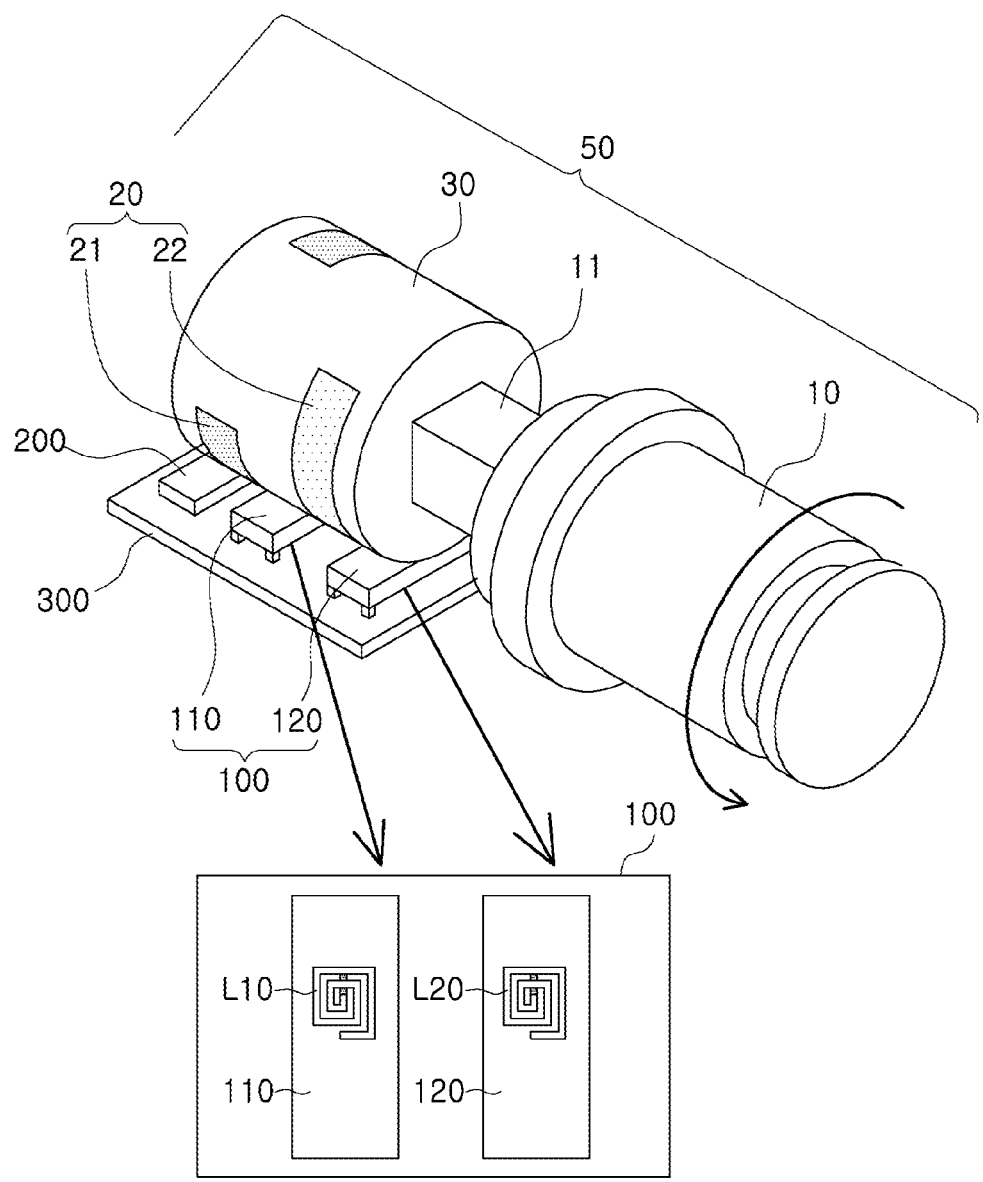
FIG. 2 is a diagram illustrating an example of a moving body sensing device.

FIG. 2 is a diagram illustrating an example of a moving body sensing device.

Since a moving body sensing device illustrated in FIG. 2 is similar to that illustrated in FIG. 1, in addition to the description of FIG. 2 below, the above descriptions of FIG. 1 are also applicable to FIG. 2, and are incorporated herein by reference. Thus, the above description may not be repeated here.

Referring to FIG. 2, a rotating body 50 of a moving body sensing device may further include a support member 30 connected to the shaft 11.

The support member 30 may be connected to the shaft 11, and may rotate clockwise or counterclockwise around the shaft 11 depending on rotation of the wheel 10. As an example, the support member may be formed in a cylindrical shape. The support member 30 may be formed of a non-metal material. As an example, the support member 30 may be formed of plastic.

The unit 20 to be detected may be disposed on the support member 30 having the cylindrical shape. The unit 20 to be detected may include a first pattern unit 21 and a second pattern unit 22 arranged on a side surface of the support member 30.

The first pattern unit 21 may include a plurality of first patterns extending from a first height region of the support member 30 formed in the cylindrical shape along a rotation direction, and the second pattern unit 22 may include a plurality of second patterns extending from a second height region of the support member 30 formed in the cylindrical shape along the rotation direction.

Here, the plurality of first patterns of the first pattern unit 21 and the plurality of second patterns of the second pattern unit 22 may be formed of one of the metal and the magnetic material.

The support member 30 may be formed of the non-metal material such as the plastic, and the first pattern unit 21 and the second pattern unit 22 may be formed of a metal. The support member 30 may be manufactured by performing an injection-molding process of the plastic, and the first pattern unit 21 and the second pattern unit 22 may be formed by a plating process.

The first pattern unit 21 and the second pattern unit 22 may be arranged on the side surface of the support member 30. When the first pattern unit 21 and the second pattern unit 22 are arranged on the support member 30, groove portions for providing the first pattern unit 21 and the second pattern unit 22 may be formed on the side surface of the support member 30. As an example, the groove portions may extend along the rotation direction in order to form the first pattern unit 21 and the second pattern unit 22. The first pattern unit 21 and the second pattern unit 22 may be arranged in the groove portions provided in the side surface of the support member 30, and be externally exposed. As an example, a thickness of the first pattern unit 21 and the second pattern unit 22 may be the same as that of the groove portions. Therefore, a step may not be generated in the side surface of the support member 30 by the first pattern unit 21 and the second pattern unit 22 provided in the groove portions.

The rotating body sensing device illustrated in FIG. 2 may be advantageous in mass production and cost reduction since thin patterns are manufactured by a method having an excellent mass production property, such as an injection-molding process, a plating process, and like.

In addition, in relation to each of the first pattern unit 21 and the second pattern unit 22, the oscillation circuit 100 may include a first oscillation circuit 110 having a first sensing coil L10 and a second oscillation circuit 120 having a second sensing coil L10.

The unit 20 to be detected may include first to N-th pattern units (here, N is a natural number of 3 or more) 21, 22, 23, 24, . . . formed in the moving body to move depending on movement of the moving body and spaced apart from each other.

As an example, a case in which two pattern units are provided will be described with reference to FIG. 3 and a case in which four pattern units are provided will be described with reference to FIG. 4. However, these examples are provided for convenience of explanation and understanding, and the number of pattern units is not limited thereto.

Figure 3:
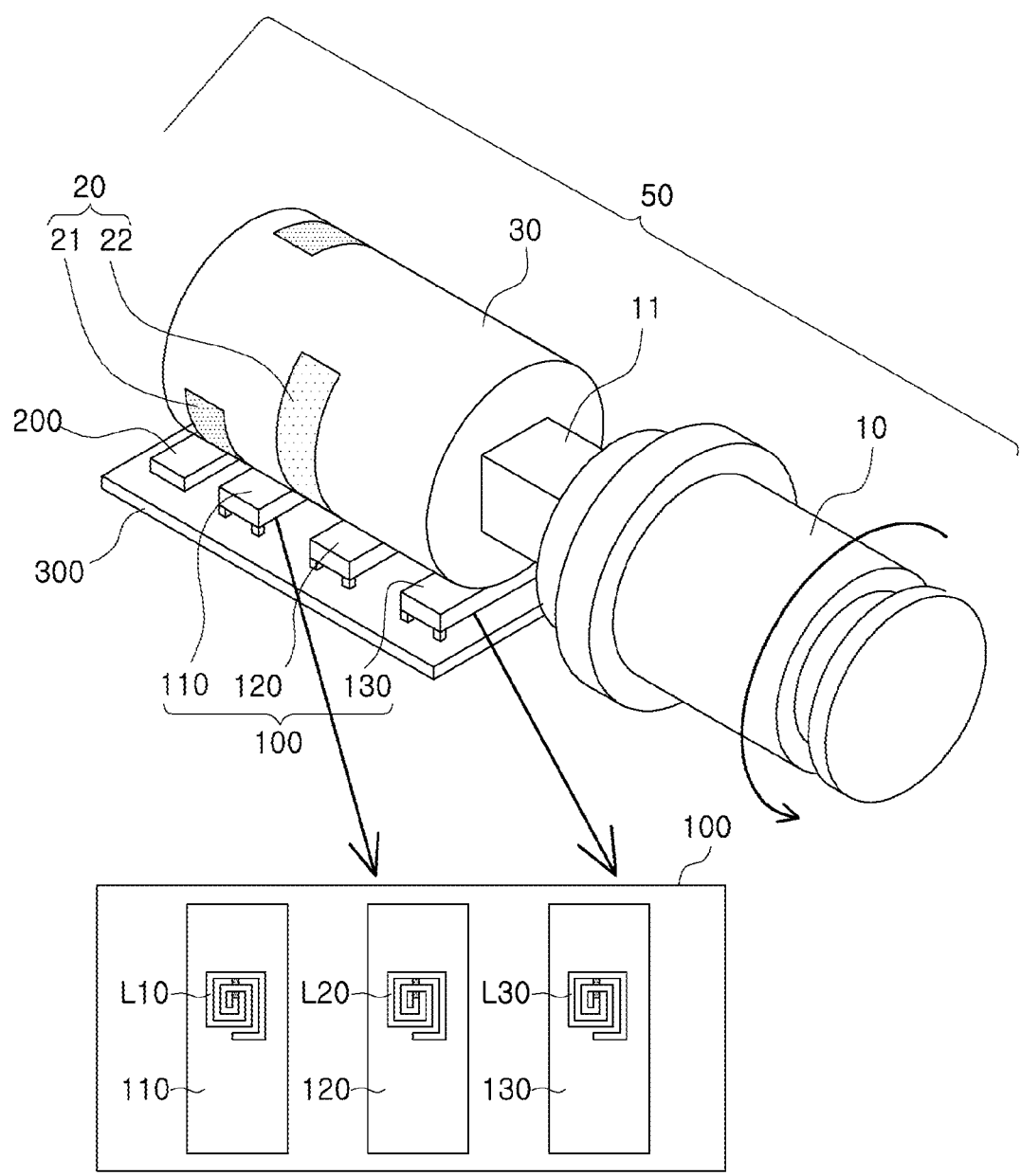
FIG. 3 is a diagram illustrating an example of a moving body sensing device.

FIG. 3 is a diagram illustrating an example of a moving body sensing device.

In addition to the description of FIG. 3 below, the above descriptions of FIGS. 1-2 are also applicable to FIG. 3, and are incorporated herein by reference. Thus, the above description may not be repeated here. Referring to FIG. 3, an oscillation circuit 100 may include a first oscillation circuit 110 having a first sensing coil L10, a second oscillation circuit 120 having a second sensing coil L20, and a third oscillation circuit 130 having a third sensing coil L30.

In an example, the third oscillation circuit 130 does not include a corresponding pattern unit, and may thus output a third sensed oscillation signal LCosc3 including noise and based on an inductance value. The third sensed oscillation signal LCosc3 may be used as a correction signal for removing the noise.

Figure 4:
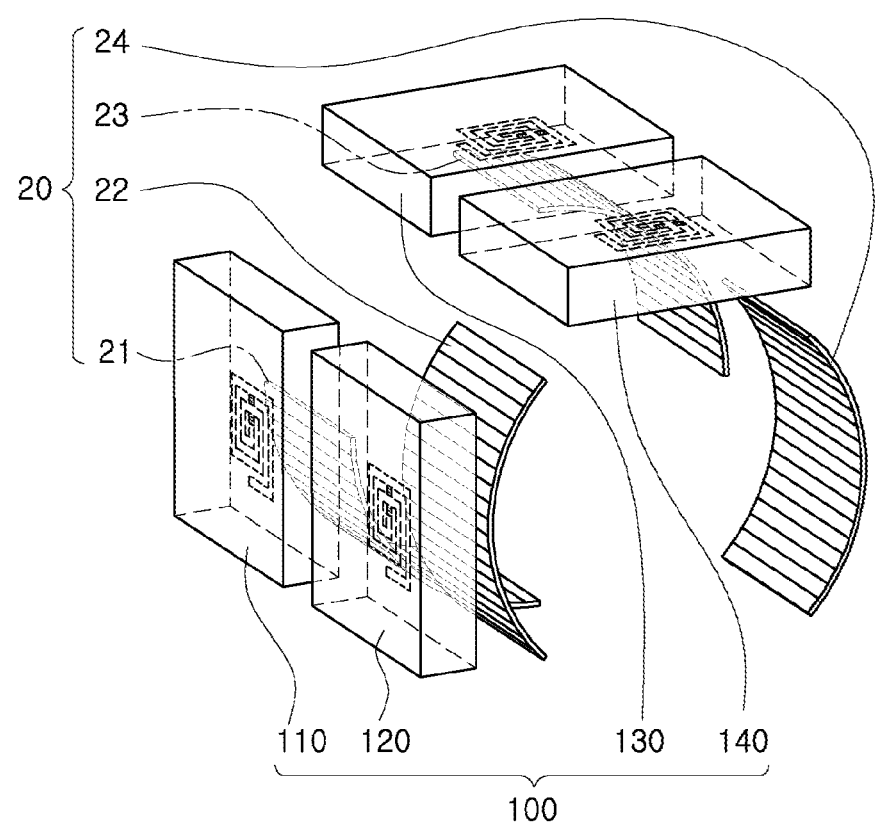
FIG. 4 is a diagram illustrating an example of a moving body sensing device.

FIG. 4 is a diagram illustrating an example of a moving body sensing device. In addition to the description of FIG. 4 below, the above descriptions of FIGS. 1-3 are also applicable to FIG. 4, and are incorporated herein by reference. Thus, the above description may not be repeated here.

Referring to FIG. 4, a unit 20 to be detected may include a first pattern unit 21, a second pattern unit 22, a third pattern unit 23, and a fourth pattern unit 24 arranged on a side surface of a support member 30 having a cylindrical shape.

In relation to each of the first pattern unit 21, the second pattern unit 22, the third pattern unit 23, and the fourth pattern unit 24, an oscillation circuit 100 may include a first oscillation circuit 110 having a first sensing coil L10, a second oscillation circuit 120 having a second sensing coil L20, a third oscillation circuit 130 having a third sensing coil L30, and a fourth oscillation circuit 140 having a fourth sensing coil L40.

A case in which two sensing coils are included, a case in which three sensing coils are included, and a case in which four sensing coils are included have been described for convenience of explanation in FIGS. 1 through 4, but the number of sensing coils is not limited thereto.

In an example, at least two sensing coils may be included. Three sensing coils may be provided as an example, four sensing coils may be provided as another example, and five sensing coils may be provided as another example.

In addition, the first pattern unit 21 and the second pattern unit 22 are not limited to the example illustrated in FIG. 2, and the first pattern unit 21, the second pattern unit 22, the third pattern unit 23, and the fourth pattern unit 24 are not limited to the example illustrated in FIG. 4. In addition, each pattern unit may include one pattern or two or more patterns In addition, shapes of the first and second patterns may be rectangular shapes as illustrated in FIG. 2. However, the shapes of the first and second patterns are not particularly limited to those illustrated in FIG. 2, and may be circular, elliptical, rhombic, trapezoidal shapes, or the like, in addition to the rectangular shapes.

Meanwhile, the moving body sensing device may use an inductance sensing manner using a plurality of sensing coils included in the oscillation circuits. In this case, the moving body sensing device may use a change in an eddy current generated depending on areas of overlap between inductances corresponding to the plurality of sensing coils and the unit 20 to be detected (a magnetic material or a non-magnetic material) very close thereto and measure a change in a frequency due to LC oscillation output from the oscillation circuits depending on the change in the eddy current to provide sensed data for measuring a rotation amount.

Figure 5:
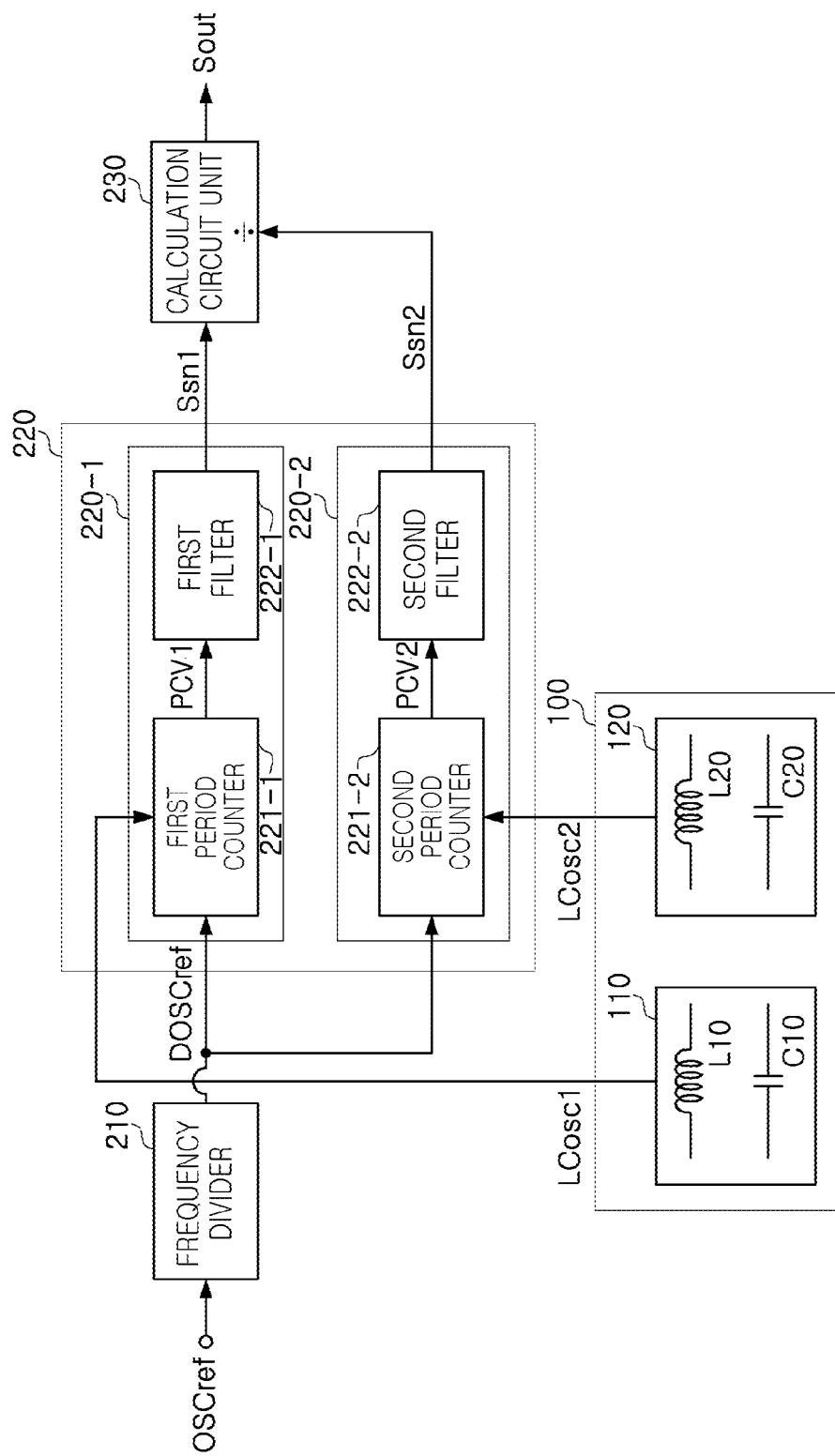
FIG. 5 is a diagram illustrating an example of a sensing circuit of a moving body.

FIG. 5 is a diagram illustrating an example of a sensing circuit of a moving body.

Referring to FIG. 5, a sensing circuit 200 of a moving body may include a frequency divider 210, a period counting circuit unit 220, and a calculation circuit unit 230. The period counting circuit unit 220 may include a first period counting circuit 220-1 and a second period counting circuit 220-2.

The frequency divider 210 may divide a frequency of the reference oscillation signal OSCref and output a frequency-divided reference oscillation signal DOSCref. As an example, the frequency divider 210 may divide the frequency of the input reference oscillation signal OSCref by a preset frequency-division number (N) to lower the frequency (for example, 1 MHz) of the reference oscillation signal OSCref to a low frequency (for example, 100 kHz) by the frequency-division number (N), and output the frequency-divided oscillation signal DOSCref.

As an example, the frequency divider 210 may be configured to select the frequency-division number (N) to obtain a desired frequency resolution, the frequency resolution of the frequency diver 210 may be calculated as the product (FLCosc*TSN) of a frequency (FLCosc) of an LC oscillation signal (for example, the lowermost frequency in LCosc1 or LCosc2) and a total sample number (TSN). Therefore, the higher the frequency (FLCosc) of the LC oscillation signal (the lowermost frequency in LCosc1 or LCosc2 or the larger the total sample number (TSN), the better the resolution.

For example, the frequency (Fosc) of the reference oscillation signal OSCref may be approximately 1 MHz, and the total sample number (TSN) may be determined as the product of the frequency-division number (N) and an accumulated gain (GAIN) of the first period counting circuit 220-1 or the second period counting circuit 220-2. As an example, when the frequency-division number (N) is 100 and the accumulated gain (GAIN) is 256, the total sample number (TSN) may be 25600. In addition, when the frequency-division number (N) is 100 and the frequency (Fosc) of the reference oscillation signal OSCref is 1 MHz, a frequency (Fosc/N) of the frequency-divided reference oscillation signal DOSCref may be 10 kHz.

The first period counting circuit 220-1 may generate a first sensed signal Ssn1 having a first period count value PCV1 counted using the first sensed oscillation signal LCosc1 for the frequency-divided reference oscillation signal DOSCref. The second period counting circuit 220-2 may generate a second sensed signal Ssn2 having a second period count value PCV2 counted using the second sensed oscillation signal LCosc2 for the frequency-divided reference oscillation signal DOSCref.

As an example, the first period counting circuit 220-1 may include a first period counter 221-1 and a first filter 222-1.

The first period counter 221-1 may count a period of the frequency-divided reference oscillation signal DOSCref from the frequency divider 210 using the first sensed oscillation signal LCosc1 to generate the first period count value PCV1 for the frequency-divided reference oscillation signal DOSCref, and provide the first period count value PCV1 to the first filter 222-1.

The first filter 222-1 may amplify the first period count value PCV1 from the first period counter 221-1 using a preset accumulated gain (GAIN) to generate a first amplified period count value APCV1, and provide the first amplified period count value APCV1 as the first sensed signal Ssn1. In an example, the first filter 222-1 may be a digital filter such as, for example, a cascade integrator comb (CIC).

In an example, the first filter 222-1 may determine the accumulated gain (GAIN) on the basis of a preset stage order (SN) and a decimator factor (R). As an example, the first filter 222-1 may determine the accumulated gain (GAIN) as a multiplier of the stage order (SN) for the decimator factor (R).

The second period counting circuit 220-2 may include a second period counter 221-2 and a second filter 222-2.

The second period counter 221-2 may count a period of the frequency-divided reference oscillation signal DOSCref from the frequency divider 210 using the second sensed oscillation signal LCosc2 to generate the second period count value PCV2 for the frequency-divided reference oscillation signal DOSCref, and provide the second period count value PCV2 to the second filter 222-2.

The second filter 222-2 may amplify the second period count value PCV2 from the second period counter 221-2 using a preset accumulated gain (GAIN) to generate a second amplified period count value APCV2, and provide the second amplified period count value APCV2 as the second sensed signal Ssn2. As an example, the second filter 222-2 may be a digital filter such as, for example, a CIC.

For example, the second filter 222-2 may determine the accumulated gain (GAIN) on the basis of a preset stage order (SN) and a decimator factor (R). As an example, the second filter 222-2 may determine the accumulated gain (GAIN) as a multiplier of the stage order (SN) for the decimator factor (R).

The first filter and the second filter described above may primarily reduce noises by performing a series of accumulation, amplification, and low pass filtering processes on the period count values.

The calculation circuit unit 230 may calculate the first sensed signal Ssn1 and the second sensed signal Ssn2 to generate an output signal Sout. As an example, the calculation circuit unit 230 may perform a division (for example, Ssn1/Ssn2 or Ssn2/Ssn1) on the first sensed signal Ssn1 and the second sensed signal Ssn2 to generate the output signal Sout. In this case, when the division is performed on the first sensed signal Ssn1 and the second sensed signal Ssn2, noise components included in each of the first sensed signal Ssn1 and the second sensed signal Ssn2 may be removed. Further description for this will be provided below.

In addition, noise components that may be caused by jitter components included in the reference oscillation signal may be removed through a calculation circuit to secondarily further reduce the noise.

The oscillation circuit 100 may include first to N-th oscillation circuits 110, 120, 130, 140, . . . fixedly mounted on the substrate 300 spaced apart from the unit 20 to be detected, including, respectively, first to N-th sensing coils L10, L20, L30, L40, . . . having first to N-th inductance values depending on areas of overlap between the first to N-th sensing coils L10, L20, L30, L40, . . . and the first to N-th pattern units 21, 22, 23, 24, . . . , and outputting, respectively, first to N-th sensed oscillation signals LCosc1, LCosc2, LCosc3, LCosc4, . . . based on the first to N-th inductance values.

In addition, the sensing circuit 200 may output an output signal Sout having movement information of the moving body on the basis of each period count value for each of the first to N-th sensed oscillation signals LCosc1, LCosc2, LCosc3, LCosc4, . . . using one reference oscillation signal OSCref.

A case in which three oscillation circuits (three sensing coils) are provided will be described with reference to FIG. 6, and a case in which four oscillation circuits (four sensing coils) are provided will be described with reference to FIG. 7. However, these cases are provided for convenience of explanation and understanding, and the number of oscillation circuits (sensing coils) are not limited thereto.

Figure 6:
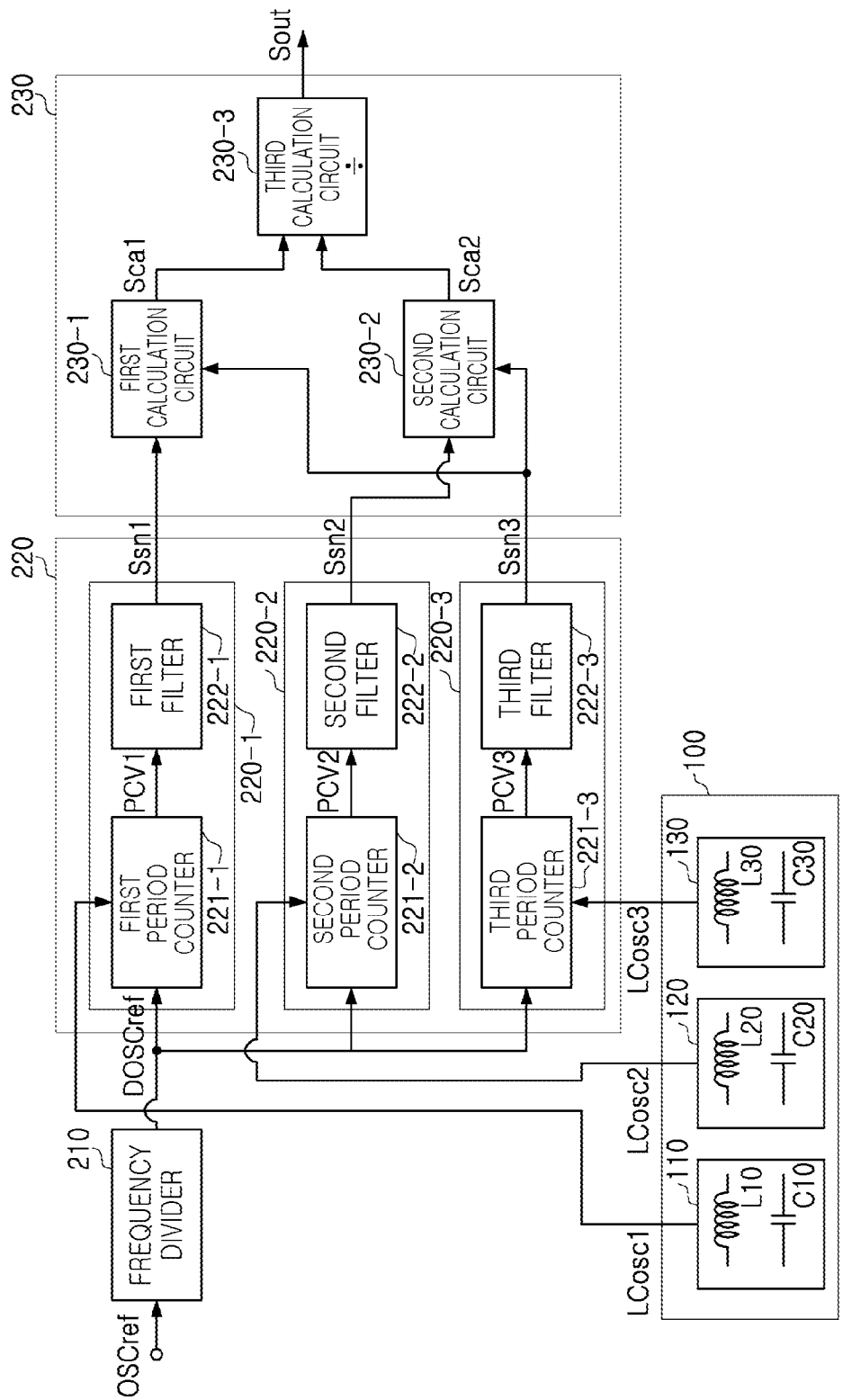
FIG. 6 is a diagram illustrating an example of a sensing circuit of a moving body according to an exemplary embodiment in the present disclosure.

FIG. 6 is a diagram illustrating an example of a sensing circuit of a moving body. In addition to the description of FIG. 6 below, the above descriptions of FIGS. 1-5 are also applicable to FIG. 6, and are incorporated herein by reference. Thus, the above description may not be repeated here.

Referring to FIG. 6, a sensing circuit 200 of a moving body may include a frequency divider 210, a period counting circuit unit 220, and a calculation circuit unit 230.

The period counting circuit unit 220 may include a first period counting circuit 220-1, a second period counting circuit 220-2, and a third period counting circuit 220-3. The calculation circuit unit 230 may include a first calculation circuit 230-1, a second calculation circuit 230-2, and a third calculation circuit 230-3.

The sensing circuit 200 of a moving body of FIG. 6 is different from that of FIG. 5 in that it further includes the third period counting circuit 220-3, the first calculation circuit 230-1, the second calculation circuit 230-2, and the third calculation circuit 230-3, and a description overlapping that of FIG. 5 will be omitted, and contents different from those of FIG. 5 will be mainly described.

The third period counting circuit 220-3 may include a third period counter 221-3 and a third filter 222-3.

The third period counter 221-3 may count a period of the frequency-divided reference oscillation signal DOSCref from the frequency divider 210 using a third sensed oscillation signal LCosc3 to generate a third period count value PCV3 for each period for the frequency-divided reference oscillation signal DOSCref, and provide the third period count value PCV3 to the third filter 222-3.

The third filter 222-3 may amplify the third period count value PCV3 from the third period counter 221-3 using a preset accumulated gain (GAIN) to output a third amplified period count value APCV3, and provide the third amplified period count value APCV3 as a third sensed signal Ssn3. As an example, the third filter 222-3 may be a digital filter such as, for example, a CIC.

For example, the third filter 222-3 may determine the accumulated gain (GAIN) on the basis of a preset stage order (SN) and a decimator factor (R). As an example, the third filter 222-3 may determine the accumulated gain (GAIN) as a multiplier of the stage order (SN) for the decimator factor (R).

The first calculation circuit 230-1 may calculate the first sensed signal Ssn1 and the third sensed signal Ssn3 to generate a first calculated signal Sca1. As an example, the first calculation circuit 230-1 may perform a subtraction on the first sensed signal Ssn1 and the third sensed signal Ssn3 to generate the first calculated signal Sca1. In this case, when the subtraction is performed on the first sensed signal Ssn1 and the third sensed signal Ssn3, noise included in the first sensed signal Ssn1 may be removed by noise included in the third sensed signal Ssn3. Further description for this will be provided below.

In addition, the second calculation circuit 230-2 may calculate the second sensed signal Ssn2 and the third sensed signal Ssn3 to generate a second calculated signal Sca2. As an example, the second calculation circuit 230-2 may perform a subtraction on the second sensed signal Ssn2 and the third sensed signal Ssn3 to generate the second calculated signal Sca2. In this case, when the subtraction is performed on the second sensed signal Ssn2 and the third sensed signal Ssn3, noise included in the second sensed signal Ssn2 may be removed by noise included in the third sensed signal Ssn3. Further description for this will be provided below.

The third calculation circuit 230-3 may generate an output signal Sout using the first calculated signal Sca1 and the second calculated signal Sca2.

Figure 7:
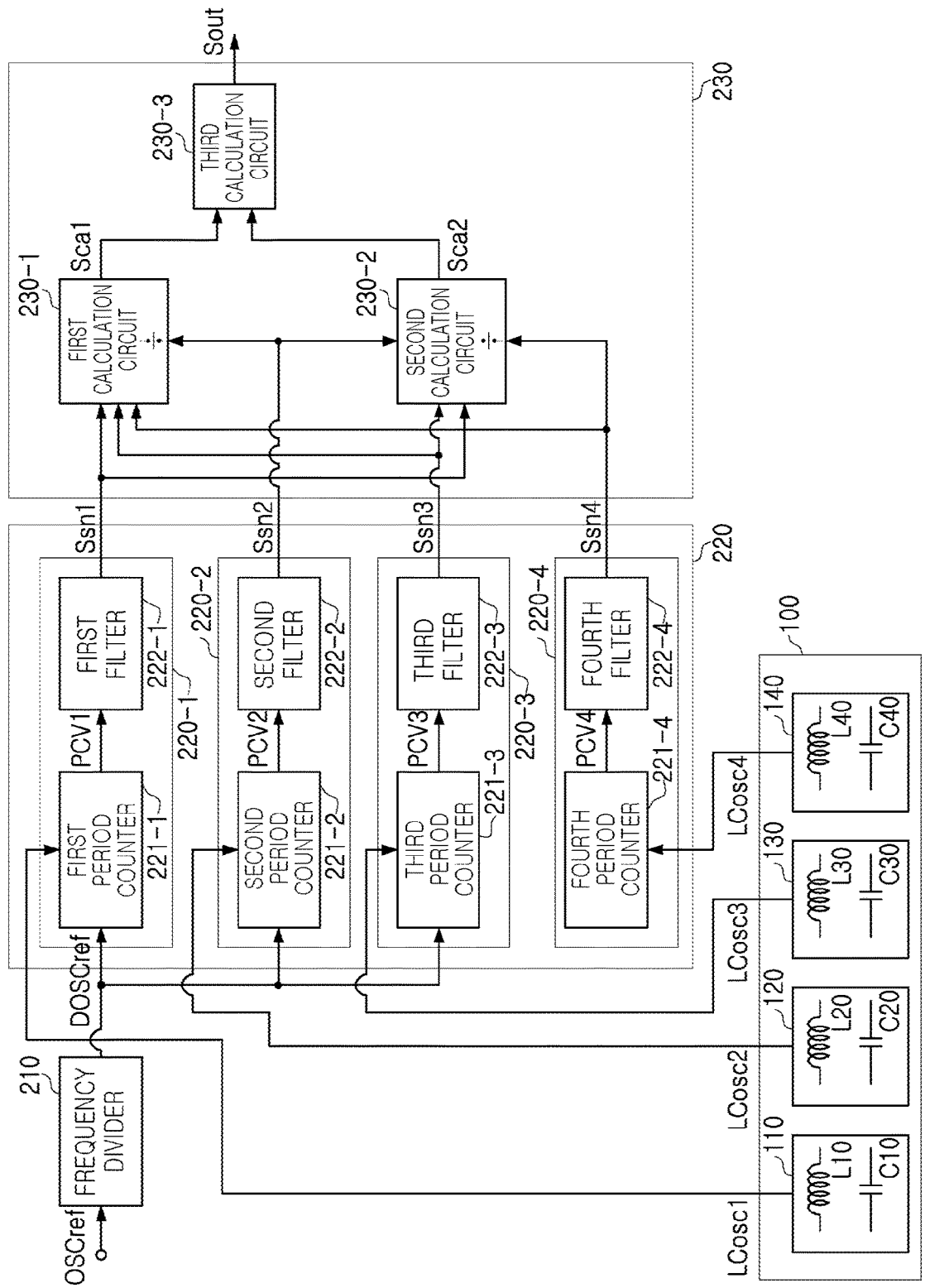
FIG. 7 is a diagram illustrating an example of a sensing circuit of a moving body.

FIG. 7 is a diagram illustrating an example of a sensing circuit of a moving body. In addition to the description of FIG. 7 below, the above descriptions of FIGS. 1-6 are also applicable to FIG. 7, and are incorporated herein by reference. Thus, the above description may not be repeated here.

Referring to FIG. 7, the oscillation circuit 100 may include first to fourth oscillation circuits 110 to 140.

The first oscillation circuit 110 may include a first capacitor C10 connected to a first sensing coil L10 in parallel to contribute LC oscillation and generate a first sensed oscillation signal LCosc1, the second oscillation circuit 120 may include a second capacitor C20 connected to a second sensing coil L20 in parallel to contribute LC oscillation and generate a second sensed oscillation signal LCosc2, the third oscillation circuit 130 may include a third capacitor C30 connected to a third sensing coil L30 in parallel to contribute LC oscillation and generate a third sensed oscillation signal LCosc3, and the fourth oscillation circuit 140 may include a fourth capacitor C40 connected to a fourth sensing coil L40 in parallel to contribute LC oscillation and generate a fourth sensed oscillation signal LCosc4.

The period counting circuit unit 220 may include first to fourth period counting circuits 220-1 to 220-4 generating, respectively, first to fourth sensed signals having first to fourth period count values counted using the frequency-divided reference oscillation signal DOSCref for each of the first to fourth sensed oscillation signals.

The calculation circuit unit 230 may calculate the first to fourth sensed signal to generate first and second calculated signal Sca1 and Sca2, and may output an output signal Sout using the first and second calculated signals Sca1 and Sca2. As an example, the calculation circuit unit 230 may include a first calculation circuit 230-1, a second calculation circuit 230-2, and a third calculation circuit 230-3.

The sensing circuit 200 of a moving body of FIG. 7 is different from that of FIG. 6 in that it further includes the fourth oscillation circuit 140 and the fourth period counting circuit 220-4 and calculation functions of the first calculation circuit 230-1, the second calculation circuit 230-2, and the third calculation circuit 230-3 are different from those of the first calculation circuit 230-1, the second calculation circuit 230-2, and the third calculation circuit 230-3 of FIG. 6, and a description overlapping that of FIG. 6 will be omitted, and contents different from those of FIG. 6 will be mainly described.

The fourth oscillation circuit 140 may include the fourth capacitor C40 connected to the fourth sensing coil L40 in parallel to contribute the LC oscillation, and generate the fourth sensed oscillation signal LCosc4.

The fourth period counting circuit 220-4 may include a fourth period counter 221-4 and a fourth filter 222-4.

The fourth period counter 221-4 may count a period of the frequency-divided reference oscillation signal DOSCref from the frequency divider 210 using the fourth sensed oscillation signal LCosc4 to generate a fourth period count value PCV4 for each period for the frequency-divided reference oscillation signal DOSCref, and provide the fourth period count value PCV4 to the fourth filter 222-4.

The fourth filter 222-4 may amplify the fourth period count value PCV4 from the fourth period counter 221-4 using a preset accumulated gain (GAIN) to output a fourth amplified period count value APCV4, and provide the fourth amplified period count value APCV4 as a fourth sensed signal Ssn4. As an example, the fourth filter 222-4 may be a digital filter such as, for example a CIC.

For example, the fourth filter 222-4 may determine the accumulated gain (GAIN) on the basis of a preset stage order (SN) and a decimator factor (R). As an example, the fourth filter 222-4 may determine the accumulated gain (GAIN) as a multiplier of the stage order (SN) for the decimator factor (R).

The first calculation circuit 230-1 may generate a first calculated signal Sca1 using the first to fourth sensed signals Ssn1 to Ssn4. The second calculation circuit 230-2 may generate a second calculated signal Sca2 using the first to fourth sensed signals Ssn1 to Ssn4. The third calculation circuit 230-3 may generate an output signal Sout using the first calculated signal Sca1 and the second calculated signal Sca2.

For example, in FIG. 7, the first calculated signal Sca1, the second Sca2, and the output signal Sout may be calculated as represented by the following Equation 1:

$$Sca1=(Ssn1-Ssn3)/(2*MAX(Ssn1,Ssn2,Ssn3,Ssn4)-(Ssn1+Ssn3))$$

$$Sca2=(Ssn2-Ssn4)/(2*MAX(Ssn1,Ssn2,Ssn3,Ssn4)-(Ssn2+Ssn4))$$

$$Sout=Sca1-Sca2. \quad [\text{Equation 1}]$$

Here, MAX( ) refers to a signal having the largest level among signals in parentheses.

Figure 8:
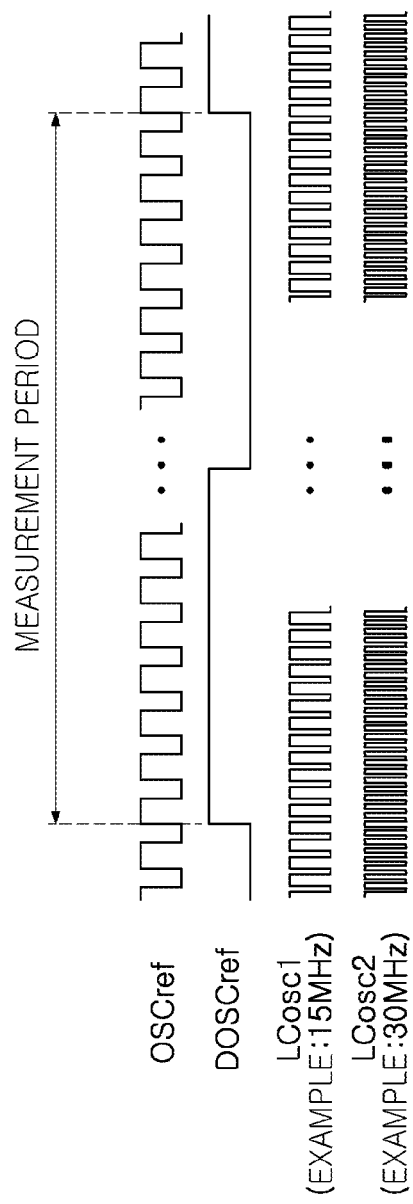
FIG. 8 is a diagram illustrating examples of a reference oscillation signal, a frequency-divided reference oscillation signal, and detected first and second oscillation signals.

FIG. 8 is a diagram illustrating examples of a reference oscillation signal, a frequency-divided reference oscillation signal, and detected first and second oscillation signals.

In FIG. 8, OSCref refers to the reference oscillation signal input to the frequency divider 210, and a frequency of the reference oscillation signal OSCref may be 1 MHz as an example. DOSCref refers to the frequency-divided reference oscillation signal output from the frequency divider 210, and a frequency of the frequency-divided reference oscillation signal DOCSref may be 100 kHz as an example. LCosc1 refers to the first sensed oscillation signal, and a frequency of the first sensed oscillation signal LCosc1 may be 15 MHz as an example. In addition, LCosc2 refers to the second sensed oscillation signal, and a frequency of the second sensed oscillation signal LCosc2 may be 30 MHz as an example.

Figure 9:
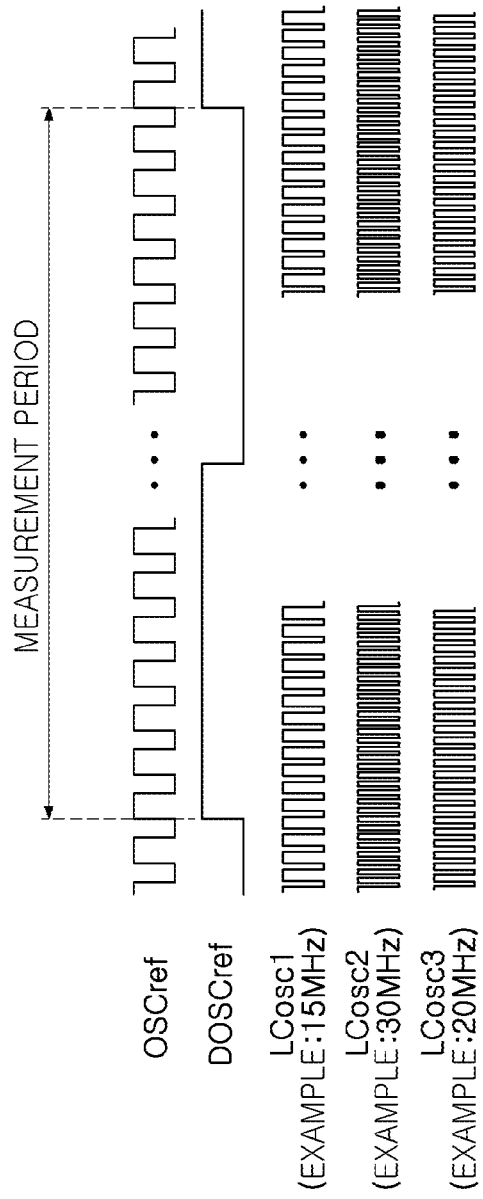
FIG. 9 is a diagram illustrating examples of a reference oscillation signal, a frequency-divided reference oscillation signal, and detected first to third oscillation signals.

FIG. 9 is a diagram illustrating examples of a reference oscillation signal, a frequency-divided reference oscillation signal, and detected first to third oscillation signals.

In FIG. 9, LCosc1 refers to the first sensed oscillation signal, and a frequency of the first sensed oscillation signal LCosc1 may be 15 MHz as an example. LCosc2 refers to the second sensed oscillation signal, and a frequency of the second sensed oscillation signal LCosc2 may be 30 MHz as an example. In addition, LCosc3 refers to the third sensed oscillation signal, and a frequency of the third sensed oscillation signal LCosc3 may be 20 MHz as an example.

Figure 10:
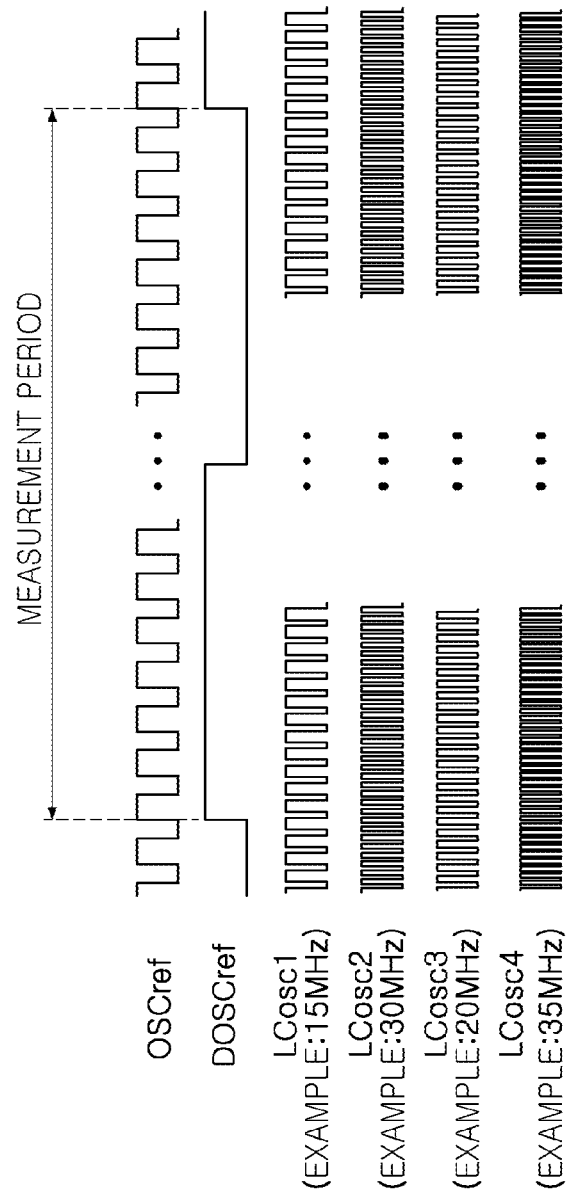
FIG. 10 is a diagram illustrating examples of a reference oscillation signal, a frequency-divided reference oscillation signal, and detected first to fourth oscillation signals.

FIG. 10 is a diagram illustrating examples of a reference oscillation signal, a frequency-divided reference oscillation signal, and detected first to fourth oscillation signals.

In FIG. 10, LCosc1 refers to the first sensed oscillation signal, and a frequency of the first sensed oscillation signal LCosc1 may be 15 MHz as an example. LCosc2 refers to the second sensed oscillation signal, and a frequency of the second sensed oscillation signal LCosc2 may be 30 MHz as an example. LCosc3 refers to the third sensed oscillation signal, and a frequency of the third sensed oscillation signal LCosc3 may be 20 MHz as an example. In addition, LCosc4 refers to the fourth sensed oscillation signal, and a frequency of the fourth sensed oscillation signal LCosc4 may be 35 MHz as an example.

In an example, a manner of counting the frequency-divided reference oscillation signal DOSCref using the sensed oscillation signals such as the first to fourth sensed oscillation signals LCosc1 to LCosc4, and the like, may be used unlike a manner of counting a frequency-divided sensed signal using a reference clock. In an example, the reference oscillation signal OSCref having a relatively low frequency may be used, and power consumption may thus be reduced.

Figure 11:
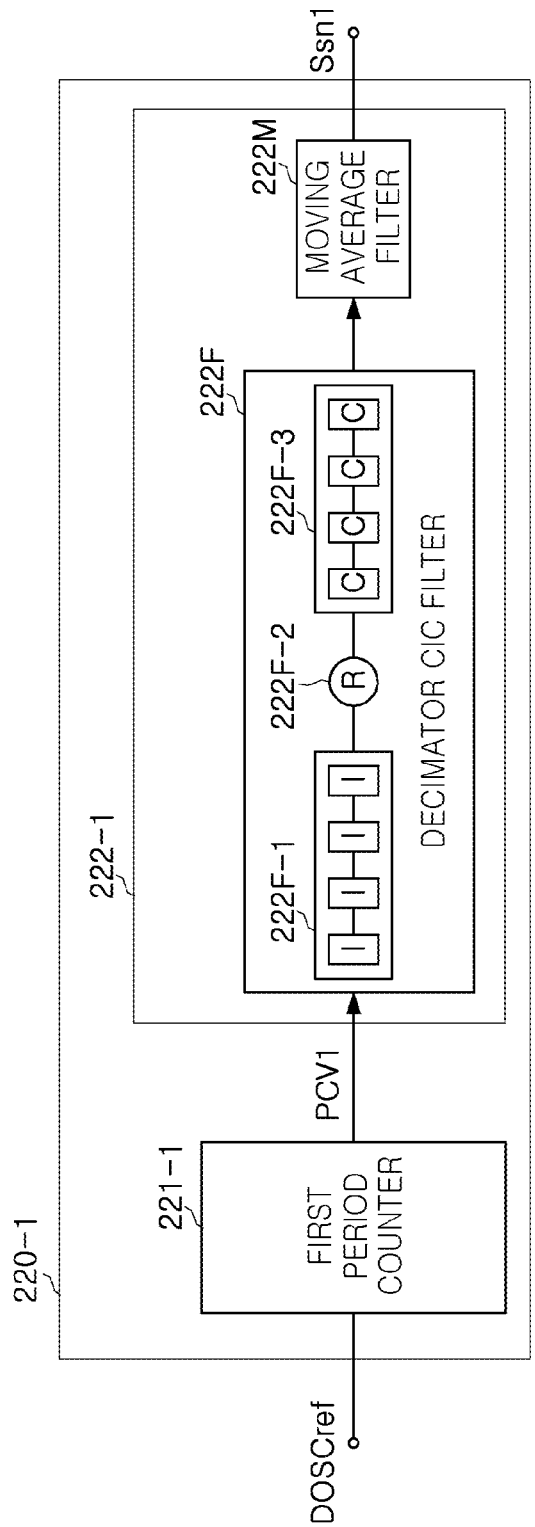
FIG. 11 is a diagram illustrating an example of a first filter.

FIG. 11 is a diagram illustrating an example of a first filter.

Referring to FIG. 11, as an example, the first filter 222-1 may include a decimator CIC filter 222F, and may optionally include a moving average filter 222M.

The decimator CIC filter 222F may amplify the first frequency count value PCV1 from the first period counter 221-1 with the accumulated gain determined on the basis of the stage order (SN) and the decimator factor (R) and provide the first amplified period counter value APCV1.

The moving average filter 222M may calculate a moving average value for the first amplified period counter value APCV1 from the decimator CIC filter 222F and provide the moving average value for the first amplified period counter value APCV1 as the first sensed signal Ssn1.

For example, when the first filter 222-1 does not include the moving average filter 222M, the first sensed signal Ssn1 may be the first amplified period counter value APCV1. In another example, when the first filter 222-1 does not include the moving average filter 222M, the first sensed signal Ssn1 may be the moving average value for the first amplified period counter value APCV1.

In an example, the decimator CIC filter 222F may include an integration circuit 222F-1, a decimator 222F-2, and a comb circuit 222F-3.

The integration circuit 222F-1 may include a plurality of integrators I cascaded by the number corresponding to the stage order (SN), sequentially accumulate the first frequency count value PCV1 from the first period counter 221-1, and provide accumulated values for each period.

The decimator 222F-2 may sample the accumulated values for each period from the integration circuit 222F-1 one by one for each period corresponding to the decimator factor (R) and provide a downsampled accumulated value.

The comb circuit 222F-3 may include a plurality of combs C cascaded by the number corresponding to the stage order (SN), subtract the previous downsampled accumulated value from a current downsampled accumulated value from the decimator 222F-2, and provide a subtracted accumulated value for a period corresponding to the decimator factor (R).

As an example, when the stage order (SN) is quaternary, the decimator factor (R) is 1, and a comb differential delay M is 4, the decimator CIC filter 222F may be a 4 stage 4 decimator CIC digital filter. In this example, the accumulated gain (GAIN) may be $256[(R*M)^{SN}=(1*4)^4]$ corresponding $4^4$. Here, the stage order (SN), the decimator factor (R), and the comb differential delay M are only examples, and are not limited thereto.

As an example, the integration circuit 222F-1 may include four integrators I, sequentially accumulate the first frequency period count value PCV1 from the first period counter 221-1 and a fourth period delayed value, and provide accumulated values for each period. As an example, the integration circuit 222F-1 may include the four integrators I.

The decimator 222F-2 may sample the accumulated values for each period from the integration circuit 222F-1 one by one for every four periods corresponding to the decimator factor (R=4) and provide a ¼ downsampled accumulated value. As an example, the comb circuit 222F-3 may include four combs C.

As an example, in the first filter 222-1, as described above, when the first period count value PCV1 is 49 and the accumulated gain (GAIN) is 256, the first amplified period count value APCV1 may be 49*256(=12544), which is the product of the first period count value PCV1 of 49 and the accumulated gain (GAIN) of 256. That is, the first filter 222F-1 may amplify the first period count value PCV1 for the frequency-divided reference oscillation signal generated by dividing the frequency of the input reference oscillation signal using the first accumulated gain (GAIN) to achieve an effect of obtaining a large sample number even though a small frequency-division number is used.

Referring to FIG. 11, as an example, when the moving average filter 222M is a 16-moving average filter, the moving average filter 222M may calculate a moving average value for the frequency value from the decimator CIC filter 222F in 16 units and provide the moving average value for the first amplified period count value as the first sensed signal Ssn1.

For example, the 16-moving average filter 222M may calculate an average for 16 data of the output value of the 4 stage 4 decimator CIC filter 222F while taking moving sum for the 16 data, thereby serving to stabilize a fluctuation of a measured frequency value. As an example, the moving average filter 222M may be a half band digital filter, or the like.

Referring to FIG. 5, in the moving body sensing device a period component and a jitter noise of a reference oscillation frequency Reference OSC may be removed, and the output signal Sout may be calculated as represented by the following Equation 2 and Equation 3 on the basis of the following examples (1) to (8):

(1) Period of Reference Oscillation Frequency Reference OSC: Tref
(2) Period of First Sensed Oscillation Signal LCosc1: Tlc1
(3) Period of Second Sensed Oscillation Signal LCosc2: Tlc2
(4) Jitter of Reference Oscillation Signal OSCref: delta
(5) Frequency-Division Number of Reference Oscillation Signal OSCref: N
(6) Gain of First and Second Filters: G
(7) Ssn1: Digital Code Value Output from First Filter
(8) Ssn2: Digital Code Value Output from Second Filter $$Sout=Ssn1/Ssn2. \qquad [\text{Equation 2}]$$

When it is assumed that a jitter of each of the first sensed oscillation signal LCosc1 and the second sensed oscillation signal LCosc2 is not present and an effect of a low pass filter is ignored in order to simplify calculation of the above Equation 2, the above Equation 2 may be represented by the following Equation 3:

$$Ssn1 = (G*N*(Tref + \text{delta}))/(Tlc1) \qquad [\text{Equation 3}]$$

$$Ssn2 = (G*N*(Tref + \text{delta}))/(Tlc2)$$

$$Sout = Ssn1/Ssn2 = [(G*N*(Tref + \text{delta}))/(Tlc1)] * [(Tlc2)/(G*N*(Tref + \text{delta}))] = (Tlc2)/(Tlc1)$$

It may be seen from the above Equations 2 and 3 that delta, a jitter component generating noise, is removed in the output signal Sout output from the moving body sensing device.

Therefore, the moving body sensing device according to the present disclosure reduces the noise caused by the jitter.

For example, referring to FIGS. 5 and 11, the output signal Sout may be calculated as represented by the following Equation 4 in the following conditions (1) to (6) on the assumption that frequency characteristics of the first and second oscillation signals Losc1 and Losc2 are changed as follows depending on a position of a magnetic material or a non-magnetic material that is to be sensed by the first and second sensing coils L10 and L20:

(1) Frequency Reference OSC of Reference Oscillation Signal=1 MHz
(2) Frequency of First Sensed Signal LSosc1=30 to 31 MHz
(3) Frequency of Second Sensed Signal LSosc2=21 to 20 MHz (It is assumed that a frequency of the second sensed signal is decreased when the first sensed signal LCosc1 is increased)
(4) Frequency-Division Number of Frequency Reference OSC of Reference Oscillation Signal: 128
(5) Gain (Gain) of First Filter (4 stage 4 decimator CIC Filter): 256
*((RM)SN (R: decimator factor, M: comb differential delay, SN=stage))
(6) Assuming that a numerator is multiplied by 216 in order to perform digital integer calculation in a calculation circuit $$Sout=(216)*[Ssn1/Ssn2]$$

$$Ssn1=256*128*30 \text{ MHz}/1 \text{ MHz to } 256*128*31 \text{ MHz}/1 \text{ MHz}=983040 \text{ to } 1015808$$

$$Ssn2=256*128*21 \text{ MHz}/1 \text{ MHz to } 256*128*20 \text{ MHz}/1 \text{ MHz}=688128 \text{ to } 655360$$

Sout(Digital output)=93622 to 101580=>7957 Code
Change Amount  [Equation 4]

Referring to the above Equation 4, it may be applied to methods such as position control of a motor, position control of an actuator, distance sensing, and the like, depending on a code change amount of the output signal Sout (digital output).

In the example described above, the calculation circuit unit 230 of FIG. 5 may perform the division on the first sensed signal Ssn1 and the second sensed signal Ssn2 to generate the output signal Sout.

In this regard, a series of arithmetic operations of the first sensed signal Ssn1 and the second sensed signal Ssn2 may be applied before and after the division of the calculation circuit unit 230. For example, an operation of (SENSING1−SENSING2)/(SENSING1+SENSING2) may be performed.

Therefore, it may be seen that a component of Tref+delta is offset when the division is performed after the series of arithmetic operations as described above in Equations.

Figure 12:
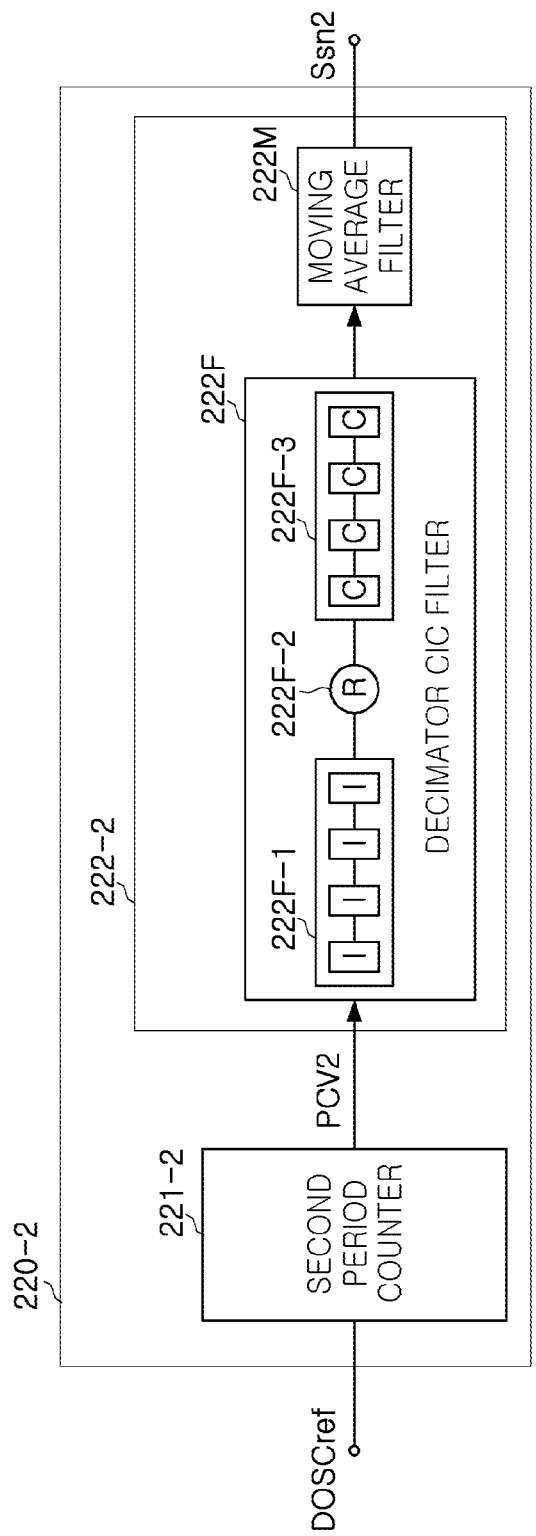
FIG. 12 is a diagram illustrating an example of a second filter.
Figure 13:
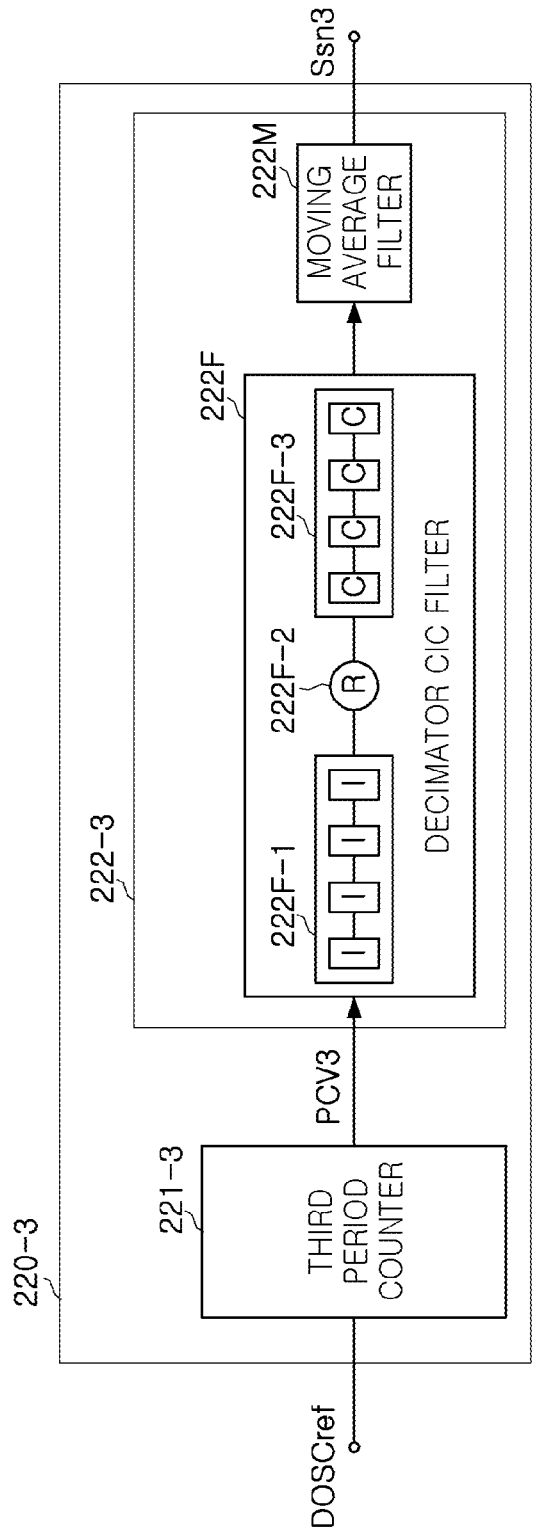
FIG. 13 is a diagram illustrating an example of a third filter.

FIG. 12 is a diagram illustrating an example of a second filter, and FIG. 13 is a diagram illustrating an example of a third filter. In addition, FIG. 14 is a diagram illustrating an example of a fourth filter.

Referring to FIG. 12, the second filter 222-2 may include a decimator CIC filter 222F, and may optionally include a moving average filter 222M.

Referring to FIG. 13, the third filter 222-3 may include a decimator CIC filter 222F, and may optionally include a moving average filter 222M.

Figure 14:
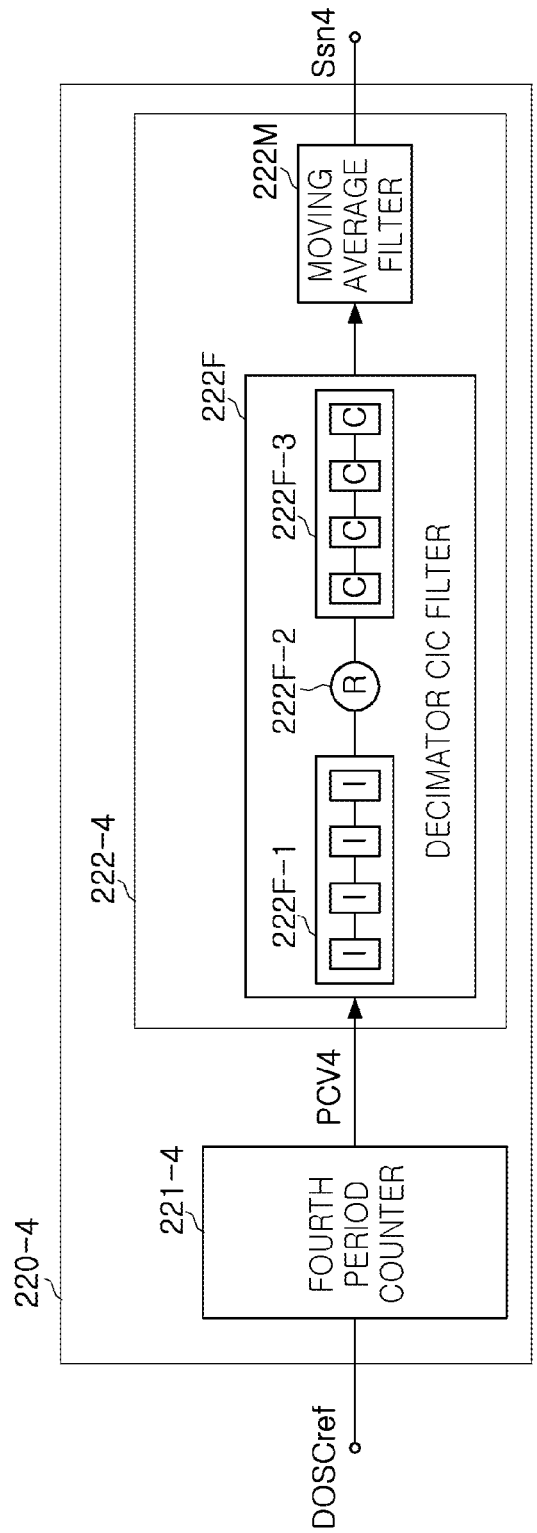
FIG. 14 is a diagram illustrating an example of a fourth filter.

Referring to FIG. 14, the fourth filter 222-4 may include a decimator CIC filter 222F, and may optionally include a moving average filter 222M.

Operations of each of the second filter 222-1 of FIG. 12, the third filter 222-3 of FIG. 13, and the fourth filter 222-4 of FIG. 14 are substantially the same as those of the first filter 222-1 illustrated in FIG. 11, thus, in addition to the description of FIGS. 12-14 below, the above descriptions of FIG. 11 are also applicable to FIGS. 12-14, and are incorporated herein by reference. Thus, the above description may not be repeated here.

Figure 15:
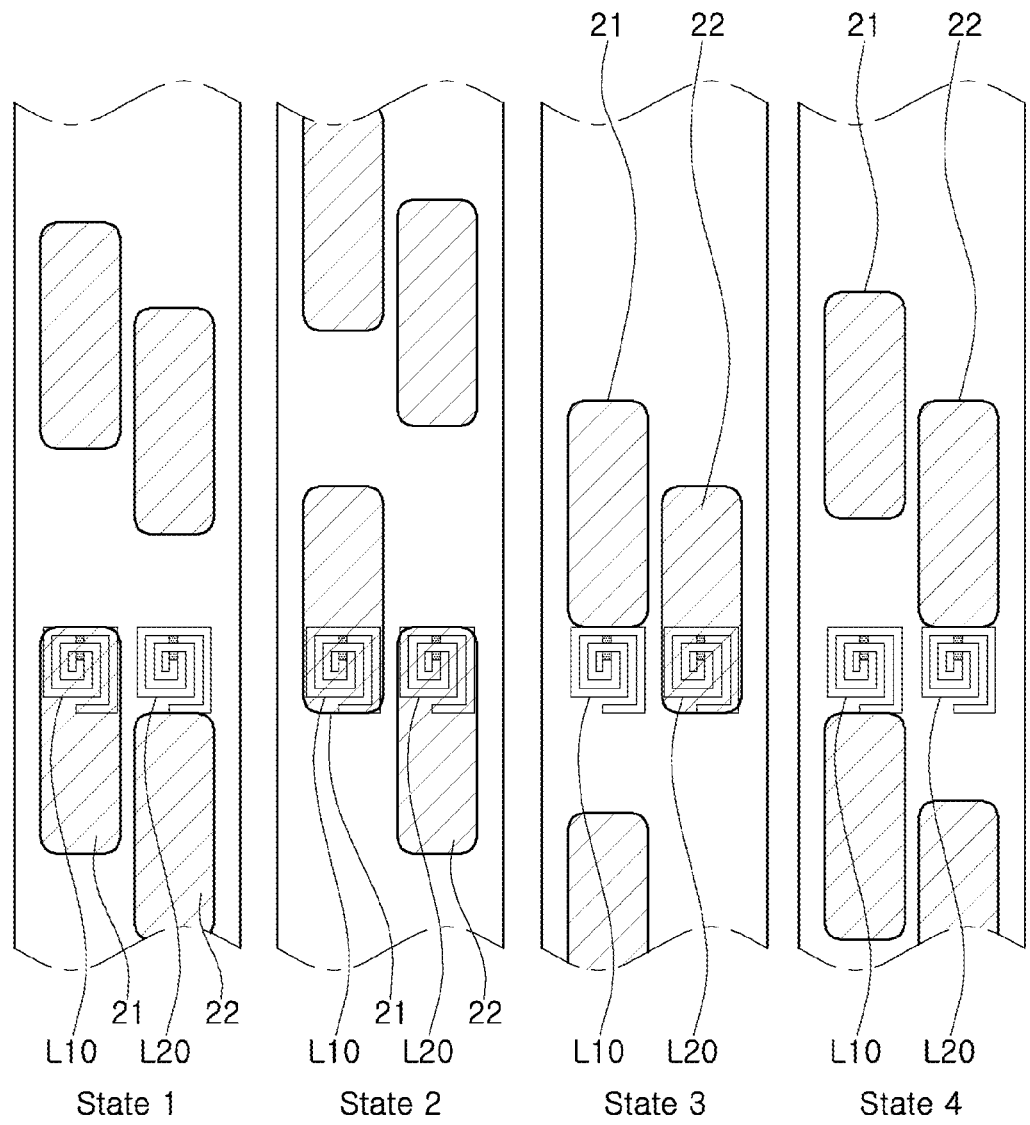
FIG. 15 is a diagram illustrating an example of a positional relationship between a unit to be detected and a sensing coil depending on rotation of the unit to be detected.
Figure 16:
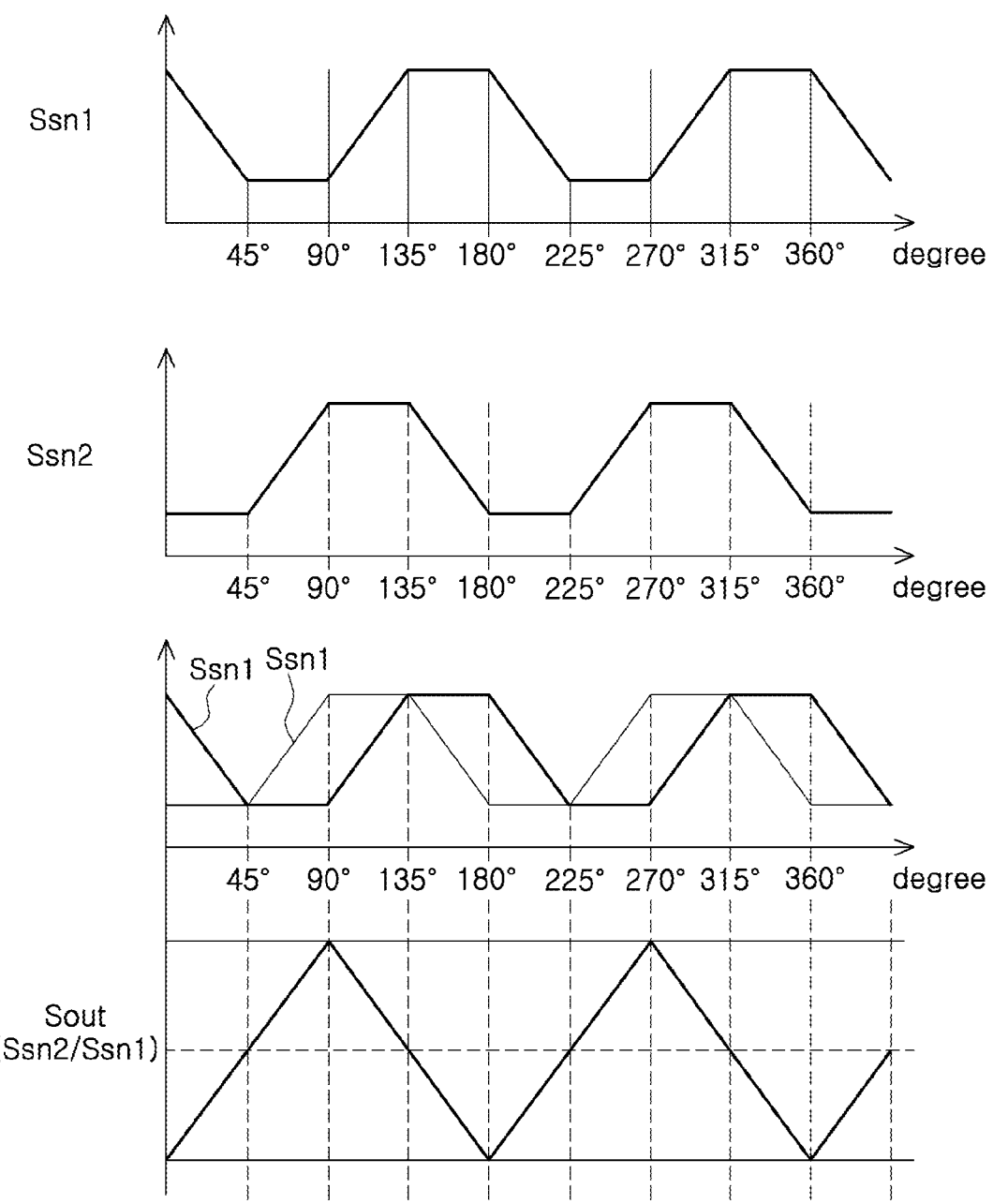
FIG. 16 is a diagram illustrating examples of waveforms of a first sensed signal and a second sensed signal output from a period counting circuit.

FIG. 15 is a diagram for describing a positional relationship between a unit to be detected and a sensing coil depending on rotation of the unit to be detected. FIG. 16 is a diagram illustrating examples of waveforms of a first sensed signal and a second sensed signal output from a period counting circuit and an output signal.

In FIGS. 15 and 16, the first sensing coil L10 and the second sensing coil L20 are illustrated as pattern coils, which are examples of the first sensing coil L10 and the second sensing coil L20.

Referring to FIGS. 15 and 16, areas of overlap between the unit 20 to be detected and the first and second sensing coils L10 and 20 may be changed by rotation of the wheel 10. In detail, an overlapping area between the first pattern unit 21 and the first sensing coil L10 and an overlapping area between the second pattern unit 22 and the second sensing coil L20 may be changed. In FIG. 15, it is assumed that the first pattern unit 21 and the second pattern unit 22 rotates from the bottom toward the top.

In a first state State 1, the first sensing coil L10 may overlap the first pattern unit 21, and the second sensing coil L20 may not overlap the second pattern unit 22. When a pattern formed of a metal material is adjacent to the first sensing coil L10 formed of a sensing coil, a current may be applied to the pattern by a magnetic flux generated in the sensing coil, and a magnetic flux may be generated in the pattern by the current applied to the pattern. In this case, the magnetic flux generated in the pattern may increase an inductance of the sensing coil of the first sensing coil L10 by a skin effect. Therefore, referring to 270° or 90° of a first state State 1 of FIG. 6 corresponding to the first state State 1 (the first pattern unit and the second pattern unit move from 360° toward 0° in FIG. 16), the first sensed signal Ssn1 may be maintained at a low level in inverse proportion to the inductance, while the second sensed signal Ssn2 of the second sensing coil L20 may be maintained at a high level.

After the first state State 1, the first pattern unit 21 and the second pattern unit 22 may rotate from the bottom toward the top, such that in a second state State 2, the first sensing coil L10 may overlap the first pattern unit 21, and the second sensing coil L20 may overlap the second pattern unit 22. Therefore, referring to 225° and 45° of FIG. 16 corresponding to the second state State 2, the first sensed signal Ssn1 of the first sensing coil L10 may be maintained at the low level in inverse proportion to the inductance, while a level of the second sensed signal Ssn2 of the second sensing coil L20 may be changed into a low level.

After the second state State 2, the first pattern unit 21 and the second pattern unit 22 may rotate from the bottom toward the top, such that in a third state State 3, the first sensing coil L10 may not overlap the first pattern unit 21, and the second sensing coil L20 may overlap the second pattern unit 22. Therefore, referring to 180° or 0° of FIG. 16 corresponding to the third state State 3, a level of the first sensed signal Ssn1 of the first sensing coil L10 may be changed into a high level, while the second sensed signal Ssn2 of the second sensing coil L20 may be maintained at the low level.

After the third state State 3, the first pattern unit 21 and the second pattern unit 22 may rotate from the bottom toward the top, such that in a fourth state State 4, the first sensing coil L10 may not overlap the first pattern unit 21, and the second sensing coil L20 may not overlap the second pattern unit 22. Therefore, referring to 135° or 315° of FIG. 16 corresponding to the fourth state State 4, the first sensed signal Ssn1 of the first sensing coil L10 may be at the high level, and a level of the second sensed signal Ssn2 of the second sensing coil L20 may be changed into a high level.

In FIGS. 15 and 16, as an example, the output signal Sout may be a signal obtained by dividing (Ssn2/Ssn1) the second sensed signal Ssn2 by the first sensed signal Ssn1, but is not limited thereto.

Figure 17:
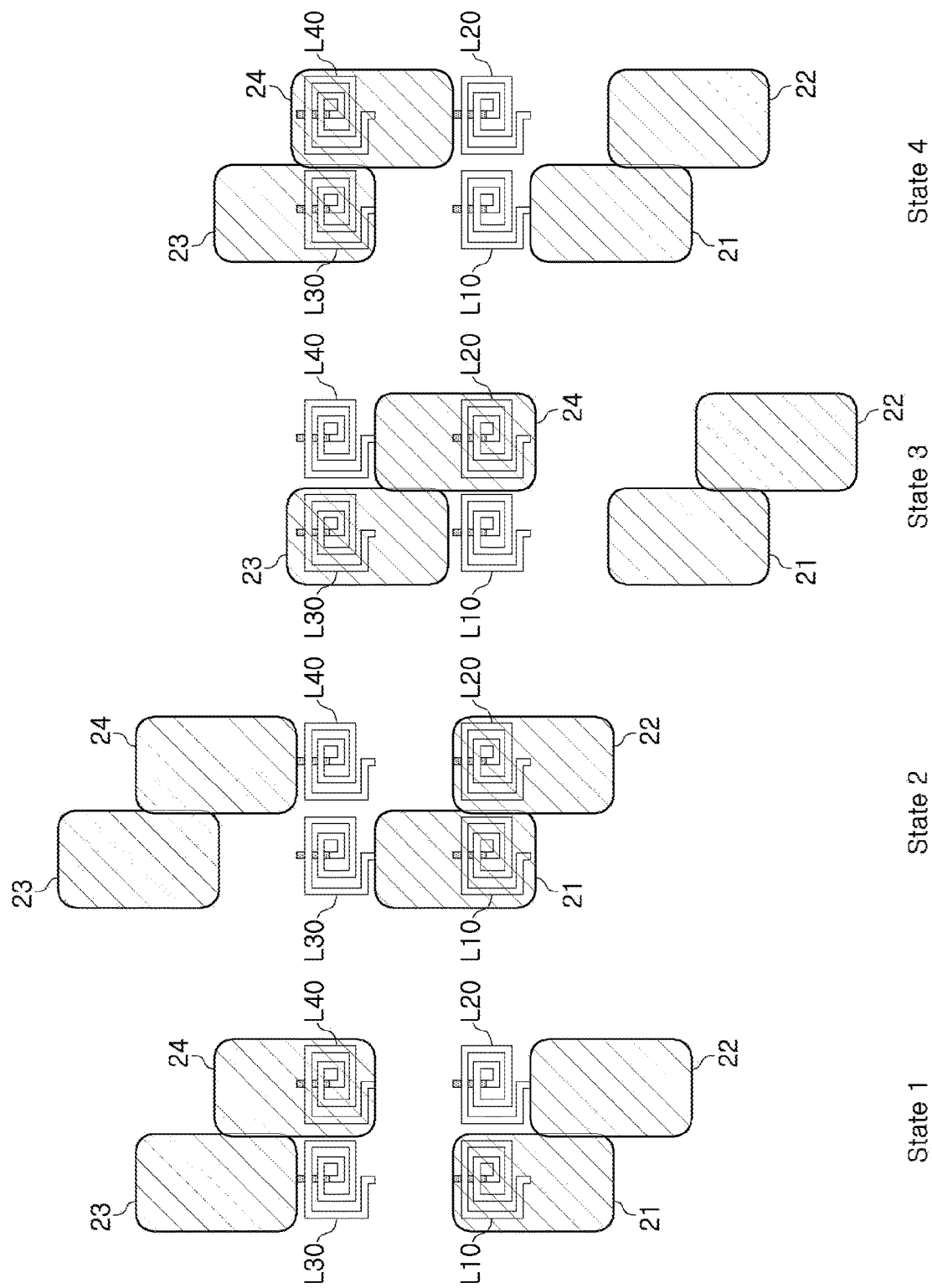
FIG. 17 are diagrams illustrating examples for describing a positional relationship between a unit to be detected and a sensing coil depending on rotation of the unit to be detected.
Figure 18:
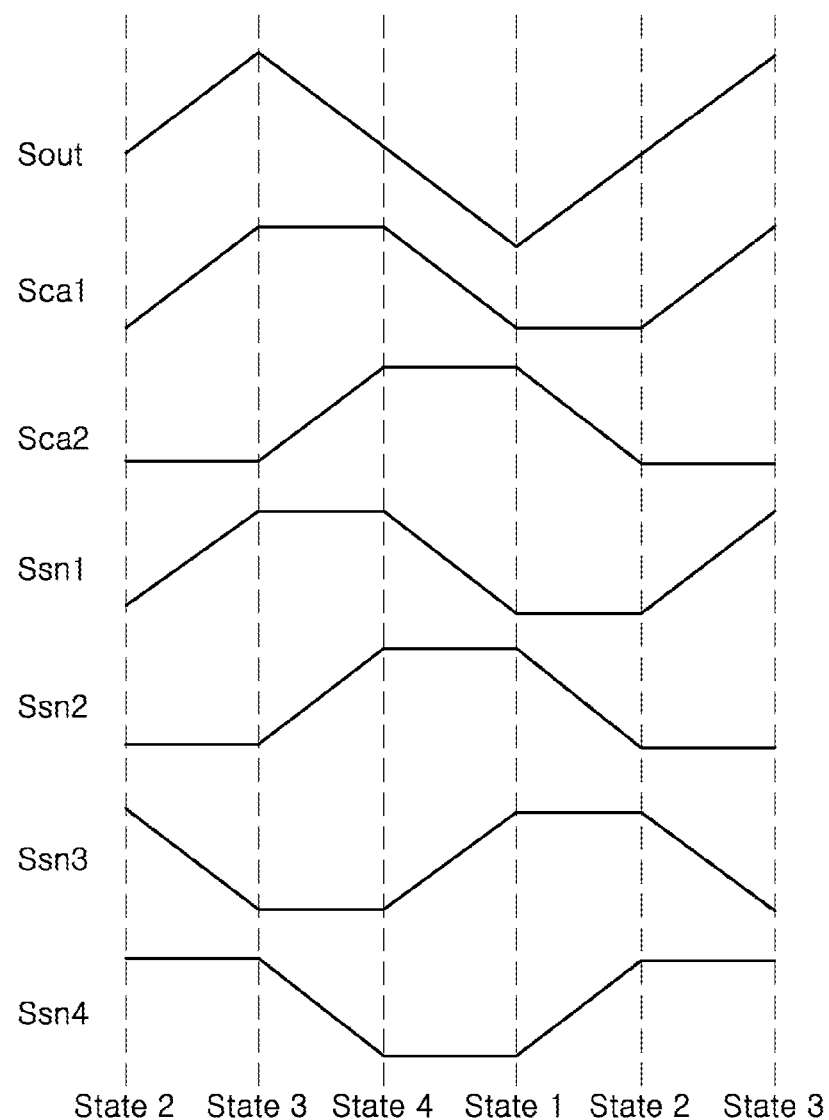
FIG. 18 are diagrams illustrating examples of a state relationship between first to fourth sensed signals output from the period counting circuit, first and second calculated signals, and an output signal.

FIG. 17 a diagram for describing a positional relationship between a unit to be detected and a sensing coil depending on rotation of the unit to be detected. FIG. 18 is a diagram illustrating a state relationship between first to fourth sensed signals output from the period counting circuit, first and second calculated signals, and an output signal.

Referring to FIGS. 4, 7, 17, and 18, in a first state State 1, the first and fourth sensing coils L10 and L40 may overlap the first and fourth pattern units 21 and 24, respectively, and the second and third sensing coils L20 and L30 may not overlap the second and third sensing units 22 and 23, respectively. In this case, large inductance values may be generated depending on magnetic fluxes by currents applied to corresponding patterns in the first and fourth sensing coils L10 and L40 overlapping the first and fourth pattern units 21 and 24, respectively, and small inductance values may be generated in the second and third sensing coils L20 and L30 that do not overlap the second and third pattern units 22 and 23, respectively. Therefore, as illustrated in FIG. 18, since an inductance value and a signal level are opposite to each other, the second and third sensed signals Ssn2 and Ssn3 may be high-level signals, and the first and fourth sensed signals Ssn1 and Ssn4 may be low-level signals.

In a second state State 2, after the first state State 1, the respective pattern units rotate, such that the first and second sensing coils L10 and L20 may overlap the first and second pattern units 21 and 22, respectively, and the third and fourth sensing coils L30 and L40 may not overlap the third and fourth sensing units 23 and 24, respectively. In this case, large inductance values may be generated depending on magnetic fluxes by currents applied to corresponding patterns in the first and second sensing coils L10 and L20 overlapping the first and second pattern units 21 and 22, respectively, and small inductance values may be generated in the third and fourth sensing coils L30 and L40 that do not overlap the third and fourth pattern units 23 and 24, respectively. Therefore, as illustrated in FIG. 18, since an inductance value and a signal level are opposite to each other, the third and fourth sensed signals Ssn3 and Ssn4 may be high-level signals, and the first and second sensed signals Ssn1 and Ssn2 may be low-level signals.

In a third state State 3, after the second state State 2, the respective pattern units rotate, such that the second and third sensing coils L20 and L30 may overlap the second and third pattern units 22 and 23, respectively, and the first and fourth sensing coils L10 and L40 may not overlap the first and fourth sensing units 21 and 24, respectively. In this case, large inductance values may be generated depending on magnetic fluxes by currents applied to corresponding patterns in the second and third sensing coils L20 and L30 overlapping the second and third pattern units 22 and 23, respectively, and small inductance values may be generated in the first and fourth sensing coils L10 and L40 that do not overlap the first and fourth pattern units 21 and 24, respectively. Therefore, as illustrated in FIG. 18, since an inductance value and a signal level are opposite to each other, the first and fourth sensed signals Ssn1 and Ssn4 may be high-level signals, and the second and third sensed signals Ssn2 and Ssn3 may be low-level signals.

In addition, in a fourth state State 4, after the third state State 3, the respective pattern units rotate, such that the third and fourth sensing coils L30 and L40 may overlap the third and fourth pattern units 23 and 24, respectively, and the first and second sensing coils L10 and L20 may not overlap the first and second pattern units 21 and 22, respectively. In this case, large inductance values may be generated depending on magnetic fluxes by currents applied to corresponding patterns in the third and fourth sensing coils L30 and L40 overlapping the third and fourth pattern units 23 and 24, respectively, and small inductance values may be generated in the first and second sensing coils L10 and L20 that do not overlap the first and second pattern units 21 and 22, respectively. Therefore, as illustrated in FIG. 18, since an inductance value and a signal level are opposite to each other, the first and second sensed signals Ssn1 and Ssn2 may be high-level signals, and the third and fourth sensed signals Ssn3 and Ssn4 may be low-level signals.

Figure 19:
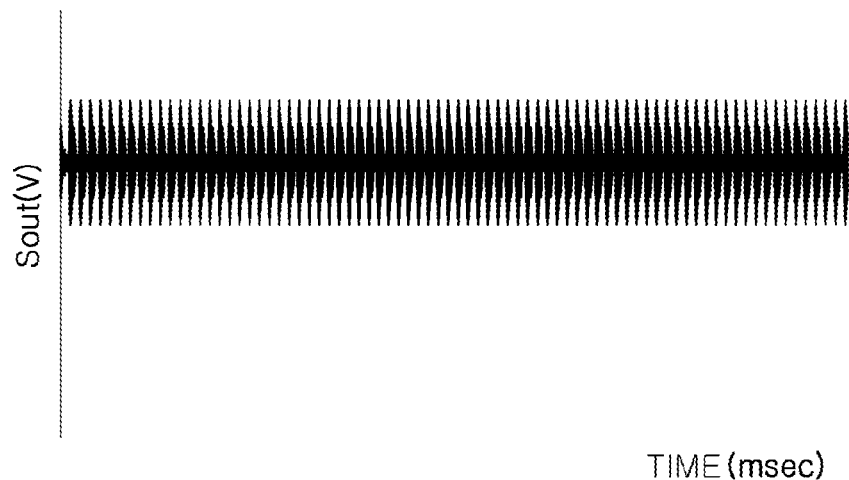
FIG. 19 is a graph illustrating an example of noise included in an output signal of a sensing device.

FIG. 19 is a graph illustrating an example of noise included in an output signal of a sensing device. The graph illustrated in FIG. 19 is a graph illustrating a magnitude Vpp of noise included in an output signal in a case in which a sensing device uses a manner of counting a frequency-divided sensed signal using a reference clock and uses one sensing coil.

Figure 20:
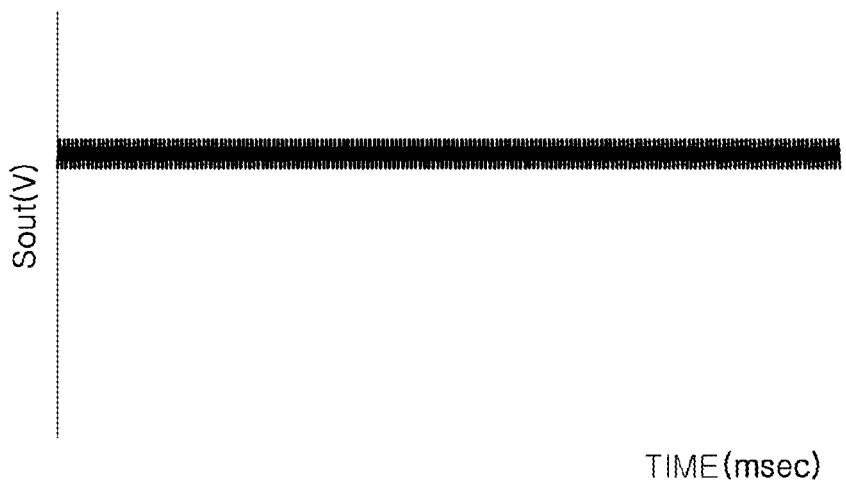
FIG. 20 is a graph illustrating an example of noise included in an output signal of the moving body sensing device.

FIG. 20 is a graph illustrating an example of noise included in an output signal of the moving body sensing device according to the embodiments described above. The graph illustrated in FIG. 20 is a graph illustrating a magnitude Vpp of noise included in the output signal of the moving body sensing device according to the present disclosure.

Graphs of FIGS. 19 and 20 are graphs illustrating measurement results in a case in which a Reference OSC is 10 MHz at the time of injecting noise of 10 to 9.8 MHz at a rate of 1 kHz into the reference oscillation frequency Reference OSC in a frequency shift keying (FSK) manner.

In the graphs of FIGS. 19 and 20, a vertical axis is a voltage axis (V), and a horizontal axis is a time axis (msec). When comparing the magnitude of the noise of FIG. 19 and the magnitude of the noise of FIG. 20 with each other, it may be seen that the magnitude of the noise included in the output signal of the moving body sensing device according to the present disclosure is relatively smaller.

The moving body sensing device according to the present disclosure as described above may be used in an actuator module of a camera. In this case, a position of the actuator module may be controlled by measuring a change in a frequency depending on a change in a position between a magnet which is the unit to be detected and the sensing coil. Alternatively, control and post-processing may be performed by sensing a position of a motor or an encoder of a rotating body.

In addition, a phase locked loop for generating a reference oscillation frequency Reference OSC that is high and has a low noise or a low drop-out (LDD) regulator for supplying a precise voltage has been required in the related art, but a manner according to the present disclosure may be used to reduce a size of an integrated circuit (IC), and lower a reference oscillation frequency Reference OSC, thereby implementing a low power circuit.

In addition, an inductance sensing manner robust to a jitter noise of the reference oscillation frequency Reference OSC may be realized.

As set forth above, a sensing circuit of a moving body and a moving body sensing device in which a reference oscillation signal having a relatively low frequency may be used to reduce power consumption and at least two sensed signals may be used to be robust to noise due to a jitter may be provided.

Therefore, the sensing circuit of a moving body and the moving body sensing device may be operated at a lower power, the noise such as the jitter may be efficiently reduced, and an influence of the noise may be reduced. As a result, a fine displacement of a rotating body may be more precisely sensed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A sensing circuit in a device having a moving body in which a unit to be detected comprising first and second pattern units spaced apart from each other is formed, comprising:
    an oscillation circuit unit comprising first and second oscillation circuits fixedly mounted on a substrate spaced apart from the unit to be detected, each of the first and second oscillation circuits comprising, respectively, first and second sensing coils having first and second inductance values depending on areas of overlap between the first and second sensing coils and the first and second pattern units, and the first and second oscillation circuits being configured to output, respectively, first and second sensed oscillation signals based on the first and second inductance values; and
    the sensing circuit being configured to output an output signal having movement information of the moving body, the sensing circuit comprising
        a frequency divider configured to divide a frequency of a reference oscillation signal and to output a frequency-divided reference oscillation signal,
        a period counting circuit unit comprising first and second period counting circuits configured to generate, respectively, first and second sensed signals having first and second period count values counted using the frequency-divided reference oscillation signal for each of the first and second sensed oscillation signals, and
        a calculation circuit unit configured to calculate the first and second sensed signals to generate the output signal.

2. The sensing circuit of claim 1, wherein the first oscillation circuit comprises a first capacitor connected to the first sensing coil in parallel to contribute LC oscillation and to generate the first sensed oscillation signal, and
    the second oscillation circuit comprises a second capacitor connected to the second sensing coil in parallel to contribute LC oscillation and to generate the second sensed oscillation signal.

3. The sensing circuit of claim 1, wherein the first period counting circuit comprises:
    a first period counter configured to count a period of the frequency-divided reference oscillation signal using the first sensed oscillation signal to generate a first period count value for the frequency-divided reference oscillation signal; and
    a first filter configured to amplify the first period count value using an accumulated gain to generate a first amplified period count value and to provide the first amplified period count value as the first sensed signal.

4. The sensing circuit of claim 3, wherein the second period counting circuit comprises:
    a second period counter configured to count a period of the frequency-divided reference oscillation signal using the second sensed oscillation signal to generate a second period count value for the frequency-divided reference oscillation signal; and
    a second filter configured to amplify the second period count value using an accumulated gain to generate a second amplified period count value and to provide the second amplified period count value as the second sensed signal.

5. The sensing circuit of claim 4, wherein the first and second filters are configured to determine the accumulated gain using a preset stage order and a decimator factor.

6. The sensing circuit of claim 5, wherein the first and second filters are configured to determine the accumulated gain as a multiplier of the stage order for the decimator factor.

7. The sensing circuit of claim 6, wherein the calculation circuit unit is configured to perform a division on the first sensed signal and the second sensed signal to generate the output signal.

8. A moving body sensing device comprising:
    a unit to be detected configured to be disposed in a moving body to move based on movement of the moving body and to comprise first to N-th pattern units spaced apart from each other;
    an oscillation circuit unit comprising first to N-th oscillation circuits fixedly mounted on a substrate spaced apart from the unit to be detected, each of first to N-th oscillation circuits comprising, respectively, first to N-th sensing coils having first to N-th inductance values depending on areas of overlap between the first to N-th sensing coils and the first to N-th pattern units, and the first to N-th oscillation circuits being configured to output, respectively, first to N-th sensed oscillation signals based on the first to N-th inductance values; and
    a sensing circuit configured to output an output signal having movement information of the moving body, the sensing circuit comprising
        a frequency divider configured to divide a frequency of a reference oscillation signal and to output a frequency-divided reference oscillation signal,
        a period counting circuit unit comprising first to N-th period counting circuits generating, respectively, first to N-th sensed signals having first to N-th period count values counted using the frequency-divided reference oscillation signal for each of the first to N-th sensed oscillation signals, and
        a calculation circuit unit configured to calculate the first to N-th sensed signals to generate first and second calculated signals and to output the output signal using the first and second calculated signals, and
    wherein N is a natural number of 3 or more.

9. The moving body sensing device of claim 8, wherein the first to N-th pattern units are formed of any one of a metal and a magnetic material having a same shape.

10. The moving body sensing device of claim 9, wherein the oscillation circuit unit comprises a first oscillation circuit, a second oscillation circuit, a third oscillation circuit, and a fourth oscillation circuit,
    the first oscillation circuit comprising a first capacitor connected to the first sensing coil in parallel to contribute LC oscillation and to generate the first sensed oscillation signal,
    the second oscillation circuit comprising a second capacitor connected to the second sensing coil in parallel to contribute LC oscillation and to generate the second sensed oscillation signal,
    the third oscillation circuit comprising a third capacitor connected to the third sensing coil in parallel to contribute LC oscillation and to generate the third sensed oscillation signal, and
    the fourth oscillation circuit comprising a fourth capacitor connected to the fourth sensing coil in parallel to contribute LC oscillation and to generate the fourth sensed oscillation signal.

11. The moving body sensing device of claim 10, wherein the first to fourth period counting circuits comprise, respectively, first to fourth period counters configured to count a period of the frequency-divided reference oscillation signal using the first to fourth sensed oscillation signals, respectively, to generate the first to fourth period count values for the frequency-divided reference oscillation signal; and first to fourth filters configured to amplify the first to fourth period count values using an accumulated gain to generate first to fourth amplified period count values and to provide the first to fourth amplified period count values as the first to fourth sensed signals.

12. The moving body sensing device of claim 11, wherein the first to fourth filters are configured to determine the accumulated gain using a preset stage order and a decimator factor.

13. The moving body sensing device of claim 12, wherein the first to fourth filters are configured to determine the accumulated gain as a multiplier of the stage order for the decimator factor.

14. The moving body sensing device of claim 13, wherein the calculation circuit unit comprises:

a first calculation circuit configured to generate the first calculated signal using the first to fourth sensed signals;

a second calculation circuit configured to generate the second calculated signal using the first to fourth sensed signals; and a third calculation circuit configured to generate the output signal using the first and second calculated signals.

* * * * *